(12) United States Patent
Kimura

(10) Patent No.: US 8,254,156 B2
(45) Date of Patent: Aug. 28, 2012

(54) DATA HOLDING DEVICE

(75) Inventor: Hiromitsu Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 269 days.

(21) Appl. No.: 12/674,220

(22) PCT Filed: Aug. 22, 2008

(86) PCT No.: PCT/JP2008/064971
§ 371 (c)(1),
(2), (4) Date: Feb. 19, 2010

(87) PCT Pub. No.: WO2009/025346
PCT Pub. Date: Feb. 26, 2009

(65) Prior Publication Data
US 2011/0128769 A1  Jun. 2, 2011

(30) Foreign Application Priority Data
Aug. 22, 2007 (JP) ................................. 2007-215599

(51) Int. Cl.
*G11C 11/22* (2006.01)
(52) U.S. Cl. .................... 365/145; 365/117; 365/189.04; 365/149; 365/189.02; 365/230.02

(58) Field of Classification Search .................. 365/145, 365/49.13, 117, 189.04, 189.02, 230.02, 365/49.12, 149
See application file for complete search history.

(56) References Cited

U.S. PATENT DOCUMENTS

| 2003/0169616 | A1  | 9/2003 | Noro |
| 2004/0105302 | A1* | 6/2004 | Fujimori ...................... 365/156 |

FOREIGN PATENT DOCUMENTS

| CN | 1444229 A  | 9/2003 |
| JP | 10-112191  | 4/1998 |
| JP | 10-255482  | 9/1998 |
| JP | 2003-263886 | 9/2003 |
| JP | 3737472    | 1/2006 |

* cited by examiner

*Primary Examiner* — Thong Q Le
(74) *Attorney, Agent, or Firm* — Fish & Richardson P.C.

(57) ABSTRACT

A data holding device comprises a loop structure part (LOOP) that holds data by use of logic gates connected in a loop (e.g., inverters INV3 and INV4 of FIG. 1); a nonvolatile storage part (CL1a, CL1b, CL2a, CL2b, Q1a, Q1b, Q2a and Q2b) that utilizes the hysteresis characteristic of a ferroelectric element to store, in a nonvolatile manner, the data held in the loop structure part (LOOP); and a circuit isolating part (MUX1, MUX2, INV6, INV7, SW3 and SW4) that electrically isolates the loop structure part (LOOP) from the nonvolatile storage part.

15 Claims, 24 Drawing Sheets

FIG.8
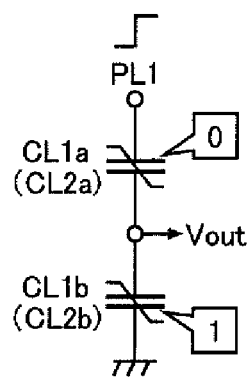
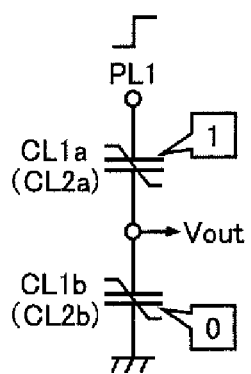
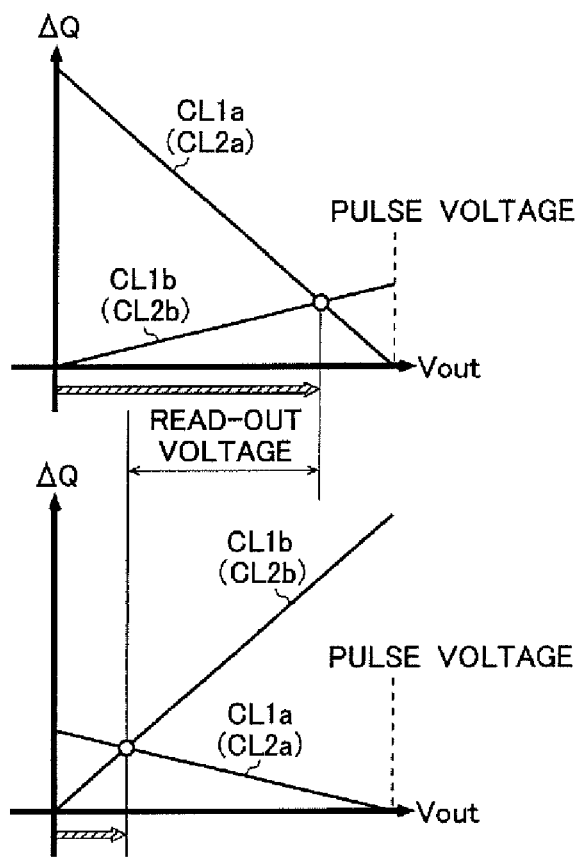

FIG.19
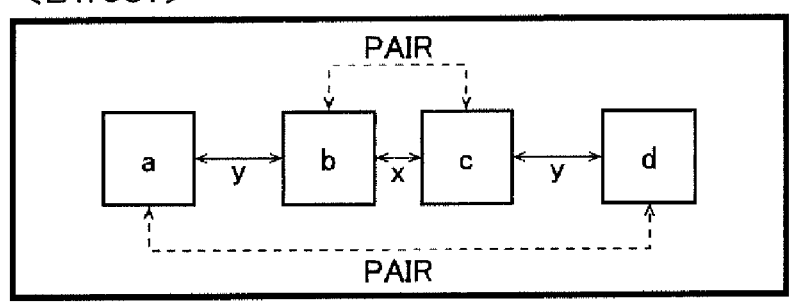
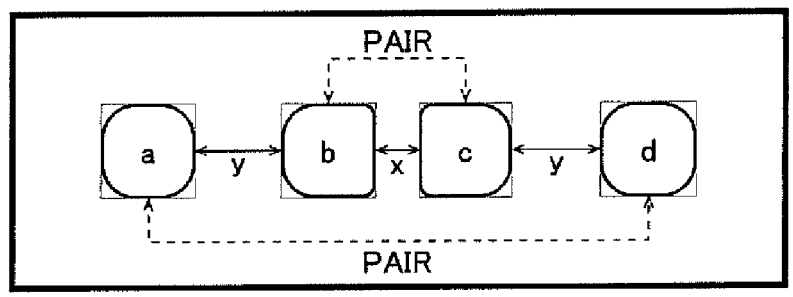

FIG.20
(a)
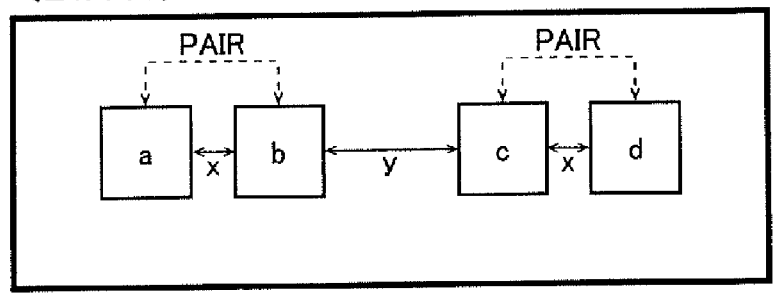
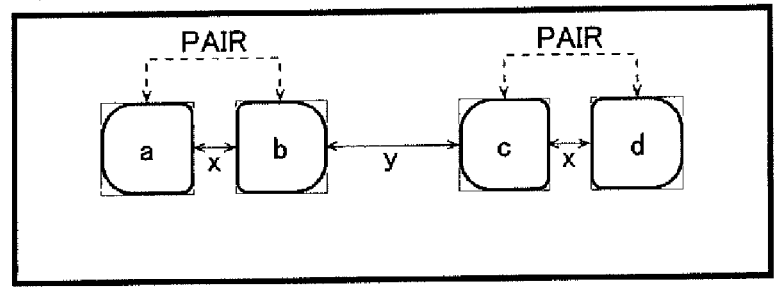
(b)
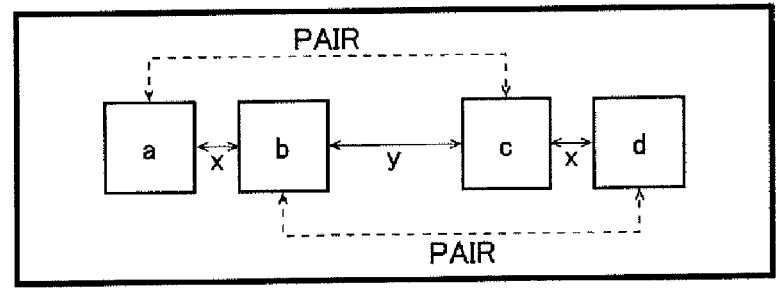
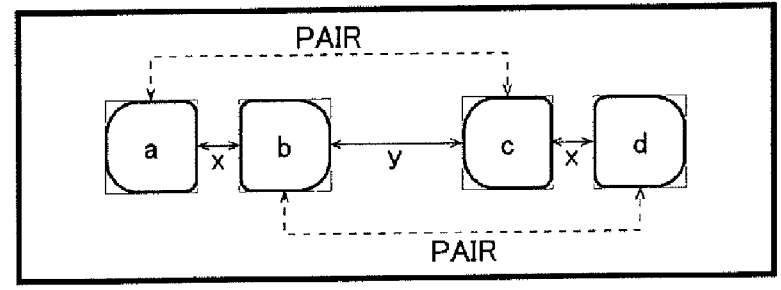

FIG.21
(a)
<LAYOUT> 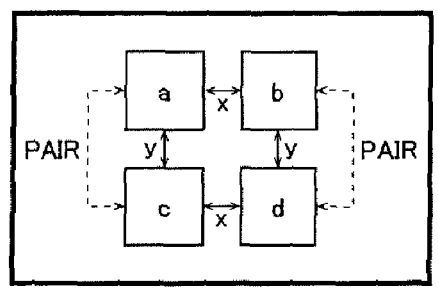 <PRACTICAL SHAPE> 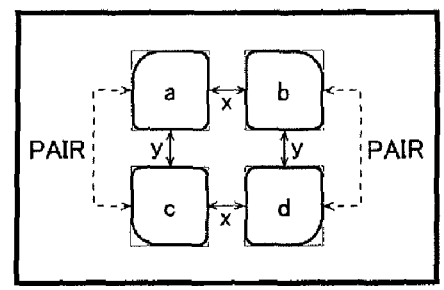
(b)
<LAYOUT> 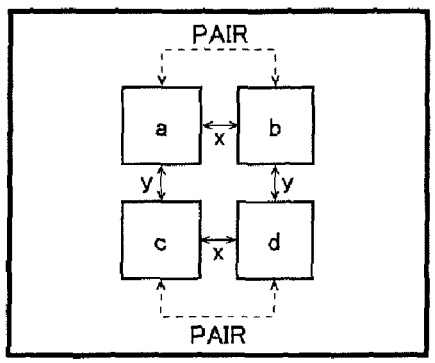 <PRACTICAL SHAPE> 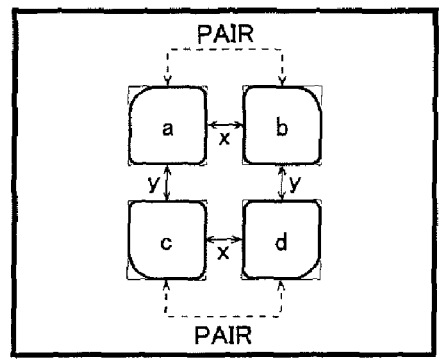
(c)
<LAYOUT> 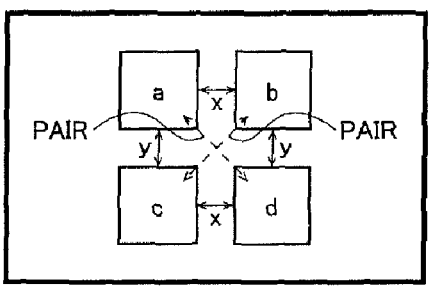 <PRACTICAL SHAPE> 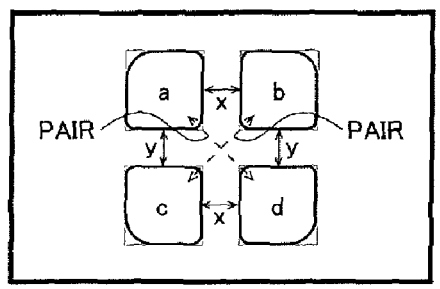

DATA HOLDING DEVICE

TECHNICAL FIELD

The present invention relates to a data holding device, and in particular, relates to a technology for achieving non-volatility in a data holding device.

BACKGROUND ART

Known examples of data holding devices for use in a sequential circuit such as a latch circuit include a circuit in which two inverter circuits are connected in series in a loop. Typically, however, such a data holding device can hold data only in a volatile manner, so data is lost once power is shut off. That is, the data before a shutdown cannot be restored even when power is turned on again.

Thus, when sequence processing using a latch circuit having such a data holding device is suspended for some reason, power supply needs to be continued to hold data, and thus electric power is accordingly consumed. Furthermore, if sequence processing is suspended due to, for example, an accidental power failure, the processing needs to be executed again from the beginning, which results in a great loss of time.

To solve these problems, Patent Document 1 filed by the applicant of the present application discloses and proposes a data holding device that holds data in a non-volatile manner by using a ferroelectric capacitor.

FIG. 23 is a circuit diagram showing a conventional example of a data holding device.

The data holding device shown in the figure is formed by connecting a ferroelectric device CL to a signal line (that is indicated by the thick line in the figure and in which held data appears as a voltage signal) in a memory device having a loop structure (the part surrounded by the broken line in the figure) formed with inverters INVx and INVy.

At a shutdown, data is written in the ferroelectric device CL by setting the state of the remanent polarization of the ferroelectric device CL by using a voltage level on the signal line. By this writing operation, data can be held in a non-volatile manner after a shutdown.

On the other hand, in an operation of reading out data written in the ferroelectric device CL, after power is turned on, with a node N in a floating state, a voltage pulse is applied to an end of the ferroelectric device CL from a plate line PL to generate, at the node N, a voltage signal corresponding to the state of the remanent polarization of the ferroelectric device CL. With respect to the voltage signal generated at the node N, data determination (0/1 determination) is performed based on a threshold value of the inverter INVx.

Patent Document 1: Japanese Patent No. 3737472

DISCLOSURE OF THE INVENTION

Problems to be Solved by the Invention

It is true that the above-described conventional data holding device is convenient since data can be held even after a shutdown.

However, during a normal operation of the above-described conventional data holding device, the ferroelectric device CL in the memory device serves as a huge load capacitor on the signal line, and this may invite disadvantages such as a reduction of the operation speed of the memory device or an increase of power consumption.

Furthermore, with the above-described conventional data holding device, in a data read-out operation, the node N needs to be in a floating state (that is, both pass switches SWx and SWy need to be turned off) such that electric charge corresponding the state of remanent polarization of the ferroelectric device CL does not escape to a power supply line or to a ground line. To achieve this, the above-described conventional data holding device requires four clock signals (CKA, /CKA, CKB, /CKB) as clock signals for driving the pass switches SWx and SWy, and this may invite an increase of power consumption.

Moreover, with the above-described conventional data holding device, as shown in FIGS. 23 and 24, capacitive coupling between the ferroelectric device CL and the gate of a transistor constituting the inverter INVx is used to read out a voltage signal Vout corresponding to the state of remanent polarization of the ferroelectric device CL. However, unlike the large capacitance (several hundred F) of the ferroelectric device CL (indicated by the solid lines rising toward right in FIG. 24), the gate capacitance of the transistor constituting the inverter INVx is small (several F), and thus the voltage signal Vout appearing at the node N is as small as on the order of 10 to 100 mV. This makes it difficult, in view of variation of capacitance among devices, to set the threshold value of the inverter INVx according to the voltage signal Vout and perform 0/1 determination with respect to read-out data.

In view of the above problems, an object of the present invention is to provide a data holding device capable of holding data in a non-volatile manner even after a shutdown, without inviting inconveniences such as reduction of operation speed and an increase of power consumption in a normal operation.

Means for Solving the Problem

To achieve the above object, according to one aspect of the present invention, a data holding device is provided with: a loop structure portion holding data by using a plurality of logic gates that are connected in a loop; a non-volatile memory portion storing data held by the loop structure portion, in a non-volatile manner, by using a hysteresis characteristic of a ferroelectric device; and a circuit separation portion electrically separating the loop structure portion and the non-volatile memory portion (first configuration).

According to the present invention, it is preferable that, in the data holding device having the first configuration described above, during a normal operation of the data holding device, the circuit separation portion electrically operates the loop structure portion, maintaining a voltage applied to the ferroelectric device at a constant level (second configuration).

According to the present invention, it is preferable that, in the data holding device having the first configuration described above, during a normal operation of the data holding device, the circuit separation portion electrically operates the loop structure portion, maintaining at least one of voltage-application electrodes of the ferroelectric device in a floating state (third configuration).

According to the present invention, it is preferable that, in the data holding device having the second or third configuration described above, data is read out from the ferroelectric device by using capacitive coupling between a ferroelectric device in a non-inversion state and a ferroelectric device in an inversion state (fourth configuration).

According to the present invention, it is preferable that, in the data holding device having the second or third configuration described above, data is read out from the ferroelectric device by using capacitive coupling between the ferroelectric device and a capacitor device other than the ferroelectric device (fifth configuration).

Specifically, it is preferable that the data holding device according to the present invention be provided with: a first multiplexer a first input terminal of which is connected, via a first pass switch, to a terminal to which an input signal is applied; a first logic gate an input terminal of which is connected to an output terminal of the first multiplexer, and from an output terminal of which an output signal is extracted; a second multiplexer a first input terminal of which is connected to the output terminal of the first logic gate; a second logic gate an input terminal of which is connected to an output terminal of the second multiplexer, and an output terminal of which is connected, via a second pass switch, to the first input terminal of the first multiplexer; a first ferroelectric device one end of which is connected to a first plate line, and an other end of which is connected, via a third pass switch, to the first input terminal of the first multiplexer and also to a second input terminal of the second multiplexer; a first transistor electrically connecting/disconnecting both ends of the first ferroelectric device to/from each other; a second ferroelectric device one end of which is connected to the first plate line and an other end of which is connected, via a fourth pass switch, to the first input terminal of the second multiplexer and also to a second input terminal of the first multiplexer; and a second transistor electrically connecting/disconnecting both ends of the second ferroelectric device to/from each other (sixth configuration).

According to the present invention, it is preferable that the data holding device having the sixth configuration described above be configured such that, in an normal operation, the first and second pass switches are exclusively on/off-controlled, the third and fourth pass switches are in an off-state, the first input terminals of the first and second multiplexers are selected, the first and second transistors are in an on-state, and the first plate line is at a certain voltage level or in a floating state, such that, in a data writing operation, the first pass switch is in an off-state, the second pass switch is in an on-state, the third and fourth pass switches are in an on-state, the first input terminals of the first and second multiplexers are selected, the first and second transistors are in an off-state, and a pulse voltage is applied to the first plate line, and such that, in a data read-out operation, the first pass switch is in an off-state, the second pass switch is in an on-state, the third and fourth pass switches are in an off-state, the second input terminals of the first and second multiplexers are selected, the first and second transistors are in an off-state, and a pulse voltage is applied to the first plate line (seventh configuration).

According to the present invention, it is preferable that the data holding device having the seventh configuration described above be further provided with: a third ferroelectric device one end of which is connected to a second plate line and an other end of which is connected to the other end of the first ferroelectric device; a third transistor electrically connecting/disconnecting both ends of the third ferroelectric device to/from each other; a fourth ferroelectric device one end of which is connected to the second plate line and an other end of which is connected to the other end of the second ferroelectric device; and a fourth transistor electrically connecting/disconnecting both ends of the fourth ferroelectric device to/from each other (eighth configuration).

According to the present invention, it is preferable that the data holding device having the eighth configuration described above be configured such that, in a normal operation, the third and fourth transistors are in an on-state, and the second plate line is at a constant voltage level or in a floating state, such that, in a data writing operation, the third and fourth transistors are in an off-state, and a pulse voltage is applied to the second plate line, and such that, in a data read-out operation, the third and fourth transistors are in an off-state, and the second plate line is at a constant voltage level or in a floating state (ninth configuration).

According to the present invention, it is preferable that the data holding device having the seventh configuration described above be further provided with: a first capacitor device one end of which is connected to a reference voltage terminal and an other end of which is connected to the other end of the first ferroelectric device; and a second capacitor device one end of which is connected to the reference voltage terminal and an other end of which is connected to the other end of the second ferroelectric device (tenth configuration).

According to the present invention, it is preferable that the data holding device having the first configuration described above be configured such that the non-volatile memory portion has a plurality of memory regions each using a ferroelectric device, and the non-volatile memory portion selects and uses, according to a predetermined control signal, a memory region in which to write data or from which to read out data (eleventh configuration).

According to the present invention, it is preferable that the data holding device having the eighth configuration described above be configured such that the first to fourth ferroelectric devices are arranged such that the first and third ferroelectric devices will be practically formed on a board as a pair of ferroelectric devices having an equal shape, and the second and fourth ferroelectric devices will be practically formed on the board as a pair of ferroelectric devices having an equal shape (twelfth configuration).

According to another aspect of the present invention, a method of writing data in the data holding device having the first configuration described above includes steps of: allowing voltage to be applied to a ferroelectric device forming the non-volatile memory portion; making a signal path from the loop structure portion to the non-volatile memory portion conductive to apply a voltage signal corresponding to data held by the loop structure portion to one end of the ferroelectric device; applying a pulse voltage to an other end of the ferroelectric device to set remanent polarization in the ferroelectric device to either an inversion or non-inversion state; cutting off the signal path from the loop structure portion to the non-volatile memory portion; and inhibiting a voltage from being applied to the ferroelectric device (thirteenth configuration).

According to another aspect of the present invention, a method of reading out data from the data holding device having the first configuration described above includes steps of: allowing a voltage to be applied to a ferroelectric device forming the non-volatile memory portion; applying a pulse voltage to one end of the ferroelectric device to extract from an other end of the ferroelectric device a voltage signal corresponding to a state of remanent polarization in the ferroelectric device; making a signal path from the non-volatile memory portion to the loop structure portion conductive, to input the voltage signal extracted from the non-volatile memory portion to the loop structure portion; cutting off the signal path from the non-volatile memory portion to the loop structure portion, to make the loop structure portion form a normal loop; and inhibiting a voltage from being applied to the ferroelectric device (fourteenth configuration).

According to the present invention, it is preferable that, in the data reading method having the fourteenth configuration described above, the step of extracting the voltage signal from the non-volatile memory portion is performed before power is turned on (fifteenth configuration).

Advantages of the Invention

With the data holding device according to the present invention, it is possible to hold data in a non-volatile manner even after a shutdown, without inviting inconveniences such as a reduction in operation speed and an increase in power consumption in a normal operation.

BRIEF DESCRIPTION OF DRAWINGS

FIG. 8 is a diagram for illustrating a data reading-out method by using capacitive coupling between ferroelectric devices;

FIG. 19 is a diagram schematically showing a first example of a cell-pattern layout;

FIG. 20 is a diagram schematically showing a second example of a cell-pattern layout;

FIG. 21 is a diagram schematically showing a third example of a cell-pattern layout;

LIST OF REFERENCE SYMBOLS

INV1 to INV8 inverter
SW1 to SW5 pass switch
MUX1, MUX2, MUX3, AND MUX4 multiplexer
DeMUX1, DeMUX2 demultiplexer
Q1$a$, Q1$b$, Q2$a$, Q2$b$ N-channel field effect transistor
Q11$a$, Q12$a$~Q1$ma$ N-channel field effect transistor
Q11$b$, Q12$b$~Q1$mb$ N-channel field effect transistor
Q21$a$, Q22$a$~Q2$ma$ N-channel field effect transistor
Q21$b$, Q22$b$~Q2$mb$ N-channel field effect transistor
CL1$a$, CL1$b$, CL2$a$, CL2$b$ ferroelectric device
CL11$a$, CL12$a$~CL1$ma$ ferroelectric device
CL11$b$, QL11$b$~CL1$mb$ ferroelectric device
CL21$a$, CL22$a$~CL2$ma$ ferroelectric device
CL21$b$, CL22$b$~CL2$mb$ ferroelectric device
C1, C2 capacitor device
NAND1~NAND4 NAND operation unit
LOOP loop structure portion

BEST MODE FOR CARRYING OUT THE INVENTION

Figure 1:
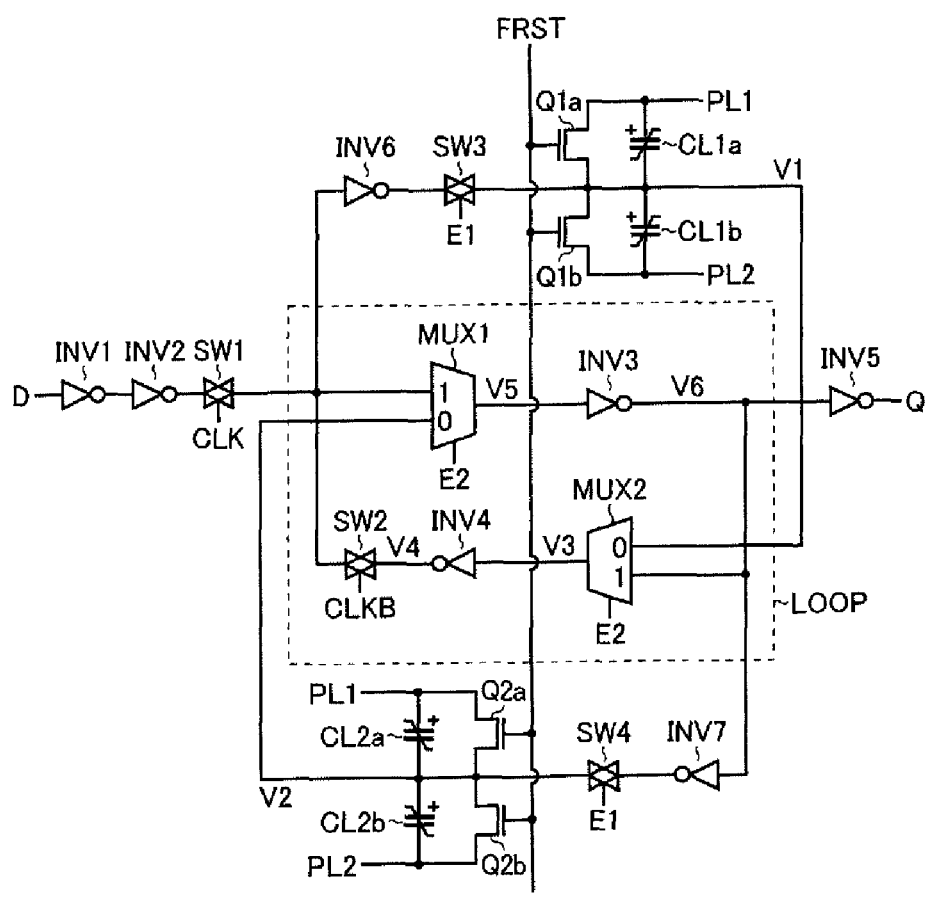
FIG. 1 is a circuit diagram showing an embodiment of a data holding device according to the present invention.

FIG. 1 is a circuit diagram showing an embodiment of a data holding device according to the present invention.

As shown in this figure, the data holding device of this embodiment is a latch circuit having inverters INV1 to INV 7, pass switches SW1 to SW4, multiplexers MUX1 and MUX2, N-channel field effect transistors Q1$a$, Q1$b$, Q2$a$, and Q2$b$, and ferroelectric devices (ferroelectric capacitors) CL1$a$, CL1$b$, CL2$a$, and CL2$b$.

An input terminal of the inverter INV1 is connected to a data signal (D) application terminal. An output terminal of the inverter INV1 is connected to an input terminal of the inverter INV2. An output terminal of the inverter INV2 is connected, via the pass switch SW1, to a first input terminal (1) of the multiplexer MUX1. An output terminal of the multiplexer MUX1 is connected to an input terminal of the inverter INV3. An output terminal of the inverter INV3 is connected to an input terminal of the inverter INV5. An output terminal of the inverter INV5 is connected to an output signal (Q) extraction terminal. A first input terminal of the multiplexer MUX2 is connected to an output terminal of the inverter INV3. An output terminal of the multiplexer MUX2 is connected to an input terminal of the inverter INV4. An output terminal of the inverter INV4 is connected, via the pass switch SW2, to the first input terminal (1) of the multiplexer MUX1.

Thus, the data holding device of this embodiment has a loop structure portion LOOP (the portion surrounded by the broken line in the figure) that holds an inputted data signal D by using two logic gates (in FIG. 1, the inverters INV3 and INV4) that are connected in a loop.

An input terminal of the inverter INV6 is connected to the first input terminal (1) of the multiplexer MUX1. An output terminal of the inverter INV6 is connected, via the pass switch SW3, to a second input terminal (0) of the multiplexer MUX2. An input terminal of the inverter INV7 is connected to the first input terminal (1) of the multiplexer MUX2. An output terminal of the inverter INV7 is connected, via the pass switch SW4, to a second input terminal (0) of the multiplexer MUX1.

A positive end of the ferroelectric device CL1a is connected to a first plate line PL1. A negative end of the ferroelectric device CL1a is connected to the second input terminal (0) of the multiplexer MUX2. Between the two ends of the ferroelectric device CL1a, the transistor Q1a is connected. A gate of the transistor Q1a is connected to an F reset signal FRST application terminal.

A positive end of the ferroelectric device CL1b is connected to the second input terminal (0) of the multiplexer MUX2. A negative end of the ferroelectric device CL1b is connected to a second plate line PL2. Between the two ends of the ferroelectric device CL1b, the transistor Q1b is connected. A gate of the transistor Q1b is connected to the F reset signal FRST application terminal.

A positive end of the ferroelectric device CL2a is connected to the first plate line PL1. A negative end of the ferroelectric device CL2a is connected to the second input terminal (0) of the multiplexer MUX1. Between the two ends of the ferroelectric device CL2a, the transistor Q2a is connected. A gate of the transistor Q2a is connected to the F reset signal FRST application terminal.

A positive end of the ferroelectric device CL2b is connected to the second input terminal (0) of the multiplexer MUX1. A negative end of the ferroelectric device CL2b is connected to the second plate line PL2. Between the two ends of the ferroelectric device CL2b, the transistor Q2b is connected. A gate of the transistor Q2b is connected to the F reset signal FRST application terminal.

Among the components described above, the pass switch SW1 is turned on/off according to a clock signal CLK, and the pass switch SW2 is turned on/off according to an inverted clock signal CLKB (a logic inverted signal of the clock signal CLK whose logic is inverse to that of the clock signal CLK). That is, the pass switches SW1 and SW2 are exclusively (complementarily) on/off-controlled. On the other hand, the pass switches SW3 and SW4 are both turned on/off according to a control signal E1. Signal paths with respect to the multiplexers MUX1 and MUX2 are selected according to a control signal E2.

Next, a detailed description will be given of an operation of the data holding device configured as described above. In the descriptions below, node voltages will be denoted by symbols in the following manner: a voltage appearing at a connection node between the ferroelectric devices CL1a and CL1b will be denoted by V1; a voltage appearing at a connection node between the ferroelectric devices CL2a and CL2b will be denoted by V2; a voltage appearing at the input terminal of the inverter INV4 will be denoted by V3; a voltage appearing at the output terminal of the inverter INV4 will be denoted by V4; a voltage appearing at the input terminal of the inverter INV3 will be denoted by V5; and a voltage appearing at the output terminal of the inverter INV3 will be denoted by V6.

Figure 2:
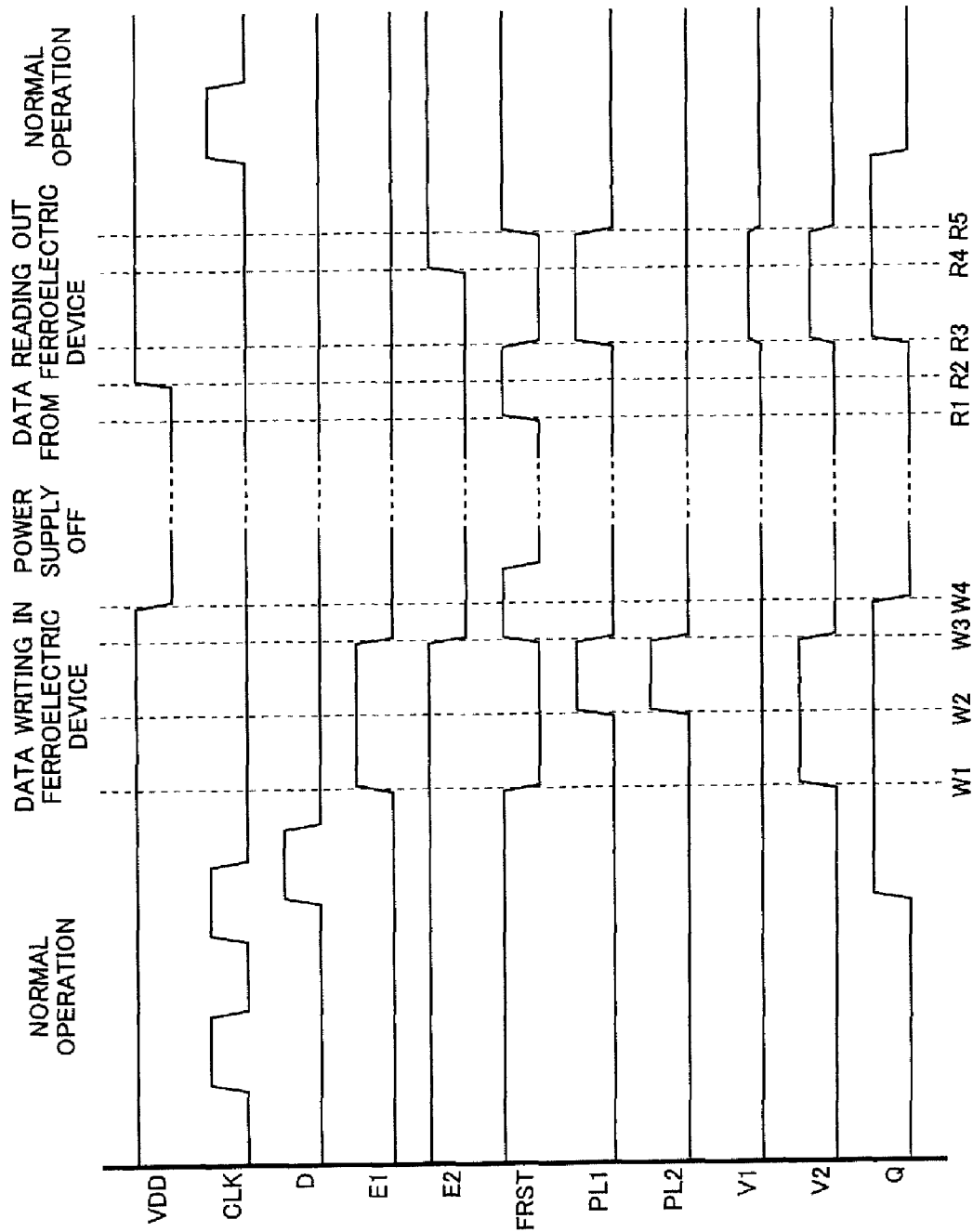
FIG. 2 is a timing chart for illustrating an example of an operation of a data holding device according to the present invention.

FIG. 2 is a timing chart for illustrating an example of an operation of a data holding device according to the present invention. In the figure, there are shown voltage waveforms of the power supply voltage VDD, the clock signal CLK, the data signal D, the control signal E1, the control signal E2, the F reset signal FRST, a voltage applied to the first plate line PL1, a voltage applied to the second plate line PL2, the node voltage V1, the node voltage V2, and the output signal Q, from top to bottom in this order.

First, the normal operation of the data holding device will be described.

Until time point W1, the F reset signal FRST is "1 (high level)", the transistors Q1a, Q1b, Q2a, and Q2b are on, and two ends of each of the ferroelectric devices CL1a, CL1b, CL2a, and CL2b are short circuited; thus, a state in which no voltage is applied to the ferroelectric devices CL1a, CL1b, CL2a, and CL2b is achieved. Meanwhile, the first and second plate lines PL1 and PL2 are "0 (low level)".

Also, until time W1, the control signal E1 is "0" and the pass switches SW3 and SW4 are off, and thus data writing drivers (the inverters INV6 and INV7 in the example of FIG. 1) are disabled.

Also, until time point W1, the control signal E2 is "1" and the first input terminals (1) of the multiplexers MUX1 and MUX2 are selected, and thus a normal loop is formed in the loop structure portion LOOP.

Thus, during a high-level period of the clock signal CLK, the pass switch SW1 is on and the pass switch SW2 is off, and thus the data signal D passes as it is as the output signal Q. On the other hand, during a low-level period of the clock signal CLK, the pass switch SW1 is off and the pass switch SW2 is on, and thus the data signal D is latched at a falling edge of the clock signal CLK.

Figure 3:
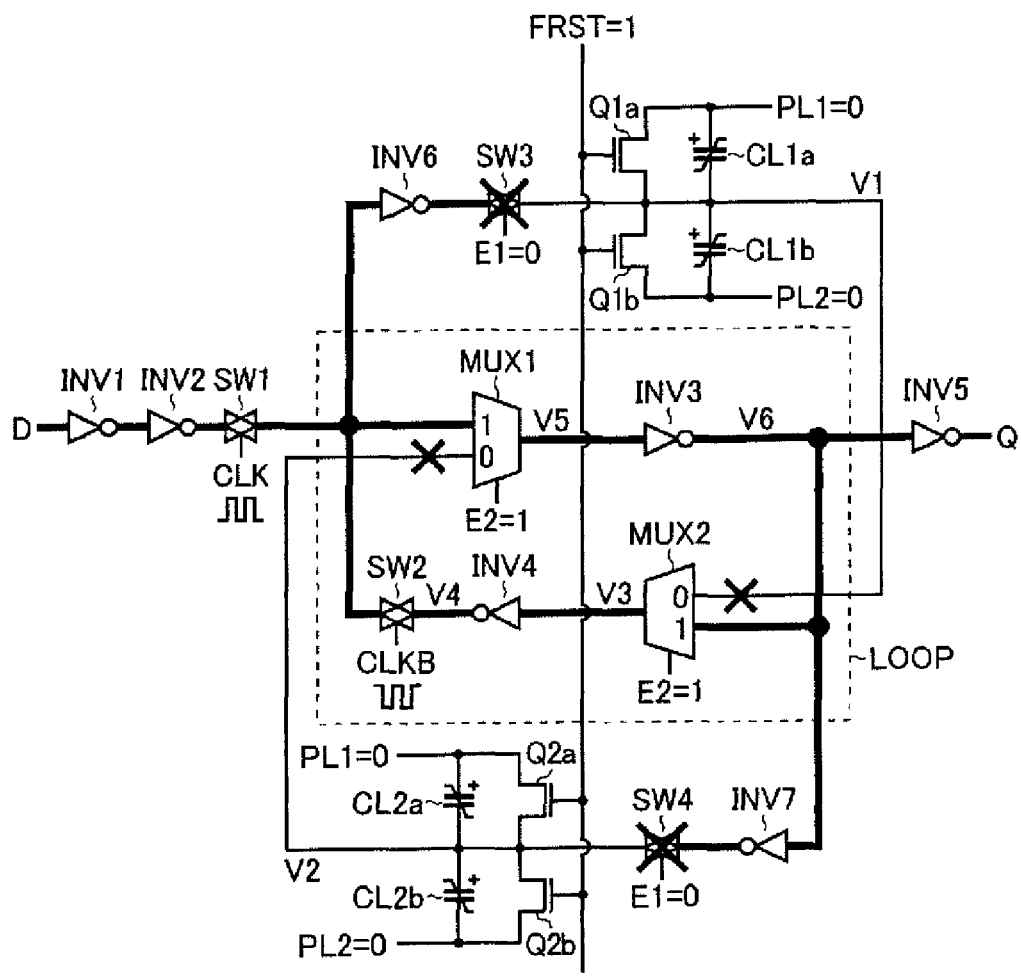
FIG. 3 is a circuit diagram showing a signal path in a normal operation.

FIG. 3 is a circuit diagram showing a signal path (described as a thick line in the figure) for the normal operation described above.

Next, the operation of writing data in the ferroelectric devices will be described.

From time point W1 to time point W3, the clock signal CLK is "0", and the inverted clock signal CLKB is "1". Thus, the first pass switch SW1 is off and the second pass switch SW2 is on. By fixing the clock signal CLK and the inverted clock signal CLKB to predetermined logics in this way, the data writing operation with respect to the ferroelectric devices can be performed with enhanced stability.

Also, from time point W1 to time point W3, the F reset signal FRST is "0" and the transistors Q1a, Q1b, Q2a, and Q2b are off, and a state is achieved in which voltages can be applied to the ferroelectric devices CL1a, CL1b, CL2a, CL2b.

Also, from time point W1 to time point W3, the control signal E1 is "1", and the pass switches SW3 and SW4 are on. Thus, data writing drivers (the inverters INV6 and INV7 in the example shown in FIG. 1) are enabled.

From time point W1 to W3, the control signal E2, which is "1" before time point W1, is "1", and the first input terminals (1) of the multiplexers MUX1 and MUX2 are selected; thus a normal loop is formed in the loop structure portion LOOP.

From time point W1 to time point W2, the first and plate lines PL1 and PL2 are "0", and from time point W2 to time point W3, the first and second plate lines PL1 and PL2 are "1". That is, a same pulse voltage is applied to the first and second plate lines PL1 and PL2. By applying a pulse voltage in this way, the states of remanent polarization in the ferroelectric devices are set either to an inversion or a non-inversion state.

Specifically, with reference to the example shown in FIG. 2, at time point W1, the output signal Q is "1", and thus the node voltage V1 is "0", and the node voltage V2 is "1". From time point W1 to time point W2, during which the first and second plate lines PL1 and PL2 are "0", a state is achieved in which no voltage is applied between the two ends of each of the ferroelectric devices CL1a and CL1b, a negative voltage is applied between the two ends of the ferroelectric device CL2a, and a positive voltage is applied between the two ends of the ferroelectric device CL2b. On the other hand, from time point W2 to time point W3, during which the first and second plate lines PL1 and PL2 are "1", a state is achieved in which no voltage is applied between the two ends of each of the ferroelectric devices CL2a and CL2b, a positive voltage is applied between the two ends of the ferroelectric device CL1a, and a negative voltage is applied between the two ends of the ferroelectric device CL1b.

By applying a pulse voltage to the first and second plate lines PL1 and PL2 in this way, the states of remanent polarization in the ferroelectric devices are set either to an inversion or a non-inversion state. The ferroelectric devices CL1a and CL1b are opposite to each other in remanent polarization state, and the ferroelectric devices CL2a and CL2b are opposite to each other in remanent polarization state. Also, the ferroelectric devices CL1a and CL2a are opposite to each other in remanent polarization state, and the ferroelectric devices CL1b and CL2b are opposite to each other in remanent polarization state.

At time point W3, the F reset signal FRST is changed to "1" again, the transistors Q1a, Q1b, Q2a, and Q2b are turned on, and the two ends of each of the ferroelectric devices CL1a, CL1b, CL2a, and CL2b are short circuited; thus, a state is achieved in which no voltage at all is applied to the ferroelectric devices CL1a, CL1b, CL2a, and CL2b. At this time, the first and second plate lines PL1 and PL2 are both changed to "0".

Also, at time point W3, the control signal E1 is changed to "0" again, and the pass switches SW3 and SW4 are turned off; thus the data writing drivers (the inverters INV6 and INV7 in the example of FIG. 1) are disabled. Incidentally, the control signal E2, which is not discussed here, is "0" in the example shown in FIG. 2.

Then, at time point W4, the power supply voltage VDD is shut off. At this time, the F reset signal FRST, which is changed to "1" at time point W3, is still maintained at "1", the transistors Q1a, Q1b, Q2a, and Q2b are on, and the two ends of each of the ferroelectric devices CL1a, CL1b, CL2a, and CL2b are short circuited. Thus, since no voltage at all is applied to the ferroelectric devices CL1a, CL1b, CL2a, and CL2b, even at a voltage variation occurring at a shutdown, no unintentional voltage is applied to the ferroelectric devices CL1a, CL1b, CL2a, and CL2b, and this helps prevent damage to data.

Figure 4:
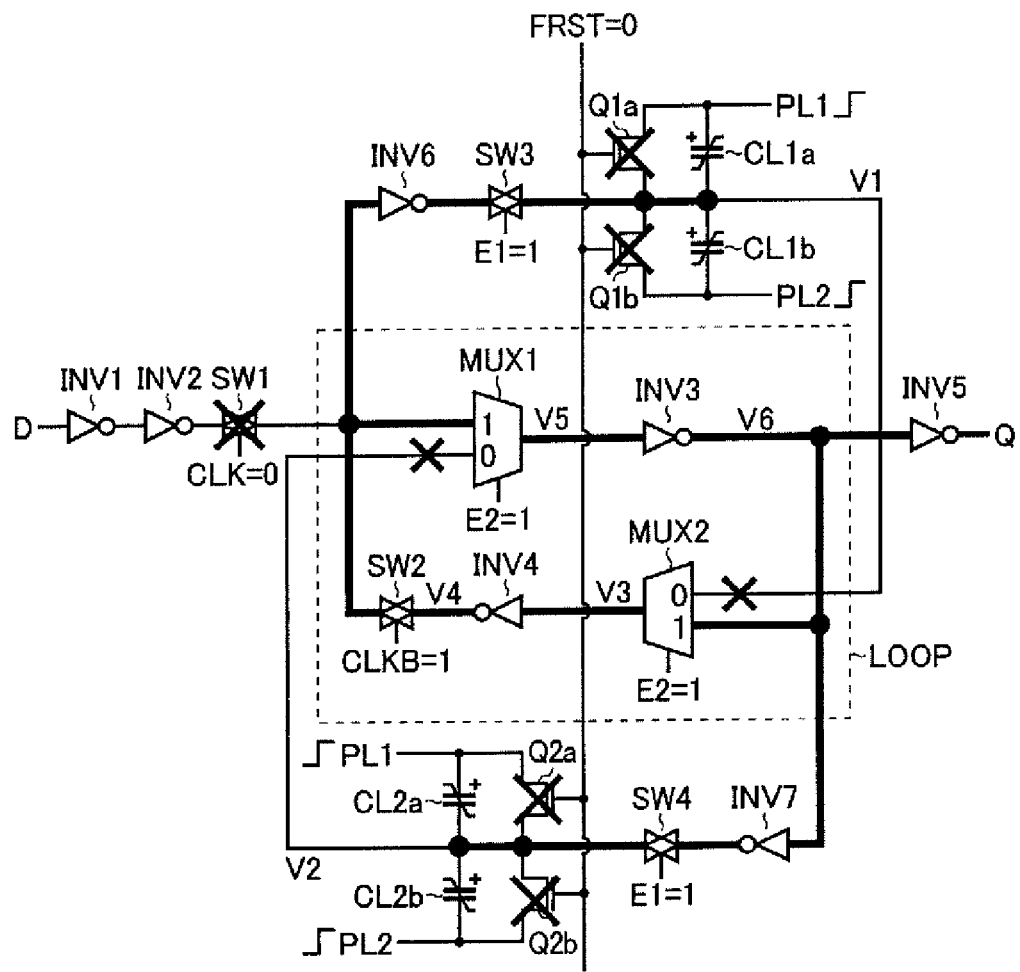
FIG. 4 is a circuit diagram showing a signal path in a data writing operation.

FIG. 4 is a circuit diagram showing a signal path (described as a thick line in the figure) in the data writing operation (particularly from time point W1 to time point W3) described above.

Next, a description will be given of an operation of reading out data from the ferroelectric devices.

From time point R1 to time point R5, the clock signal CLK is "0", and the inverted clock signal CLKB is "1". Thus, the first pass switch SW1 is off, and the second pass switch SW2 is on. By fixing the clock signal CLK and the inverted clock signal CLKB to predetermined logics in this way, the operation of reading out data from the ferroelectric devices can be performed with enhanced stability.

At time point R1, the F reset signal FRST is changed to "1" first of all, the transistors Q1a, Q1b, Q2a, and Q2b are turned on, and the two ends of each of the ferroelectric devices CL1a, CL1b, CL2a, and CL2b are short circuited. Thus, since a state is achieved in which no voltage at all is applied to the ferroelectric devices CL1a, CL1b, CL2a, and CL2b, even at a voltage variation occurring when power is turned on, no unintentional voltage is applied to the ferroelectric devices CL1a, CL1b, CL2a, and CL2b, and this helps prevent damage to data.

At time point R1, the first and second plate lines PL1 and PL2 are "0 (low level)".

Figure 5:
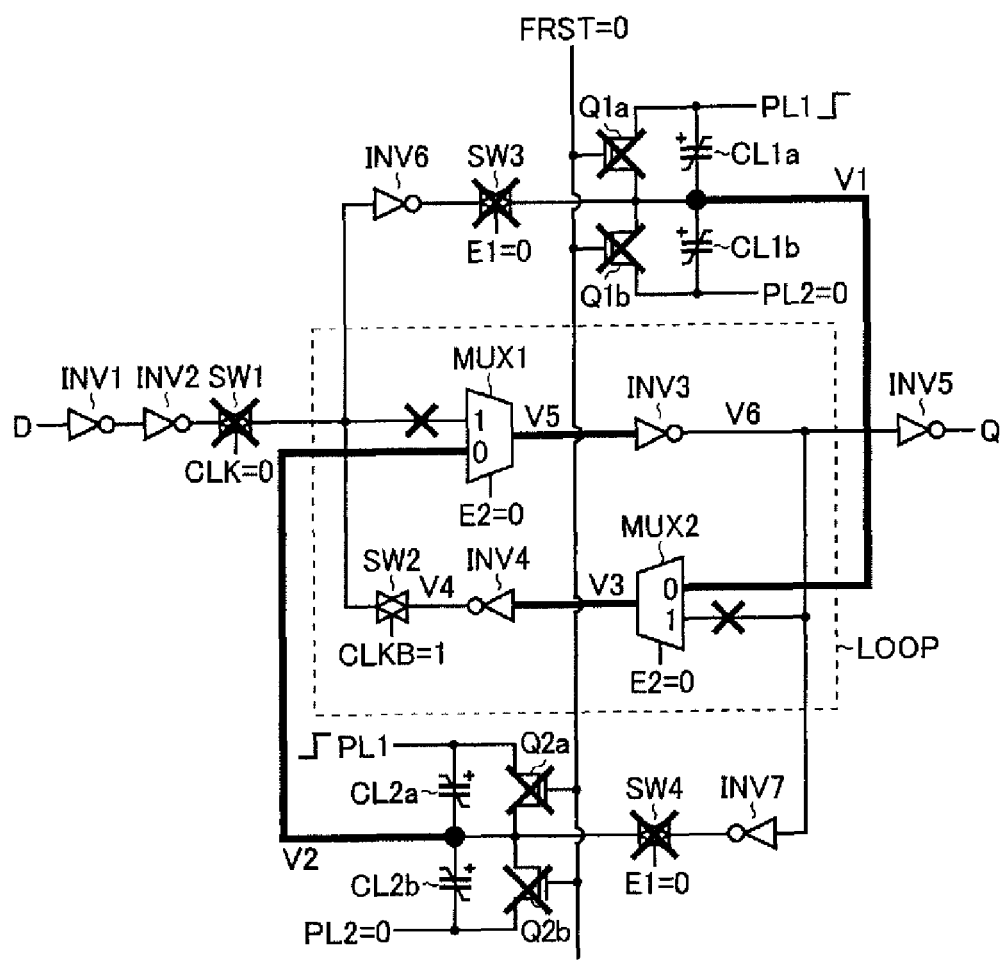
FIG. 5 is a circuit diagram showing a signal path in a data read-out operation.

At time point R2, the power supply voltage VDD is supplied in a state in which the control signals E1 and E2 are both "0" (that is, in a state in which the data writing drivers are disabled and the normal loop is disabled in the loop structure portion LOOP). At this time, the signal line indicated by the thick line in FIG. 5 is in a floating state.

At the next time point R3, the F reset signal FRST is changed to "0", the transistors Q1a, Q1b, Q2a, and Q2b are turned off, and a state is achieved in which voltages can be applied to the ferroelectric devices CL1a, CL1b, CL2a, CL2b. Meanwhile, the first plate line PL1 is changed to "1" with the second plate line PL2 maintained at "0". By applying pulse voltages in this way, voltage signals corresponding to the states of remanent polarization in the ferroelectric devices appear as the node voltages V1 and V2.

Specifically, with reference to the example shown in FIG. 2, a comparatively low voltage signal (of a logic which will hereinafter be referred to as WL (Weak Low)) appears as the node voltage V1, and a comparatively high voltage signal (of a logic which will hereinafter be referred to as WH (Weak Hi)) appears as the node voltage V2. That is, a voltage difference occurs between the node voltages V1 and V2 corresponding to the difference in remanent polarization state between the ferroelectric devices.

From time point R3 to time point R4, the control signal E2 is "0", and the second input terminals (0) of the multiplexers MUX1 and MUX2 are selected; thus the logic of the node voltage V3 is WL, and the logic of the node voltage V4 is WH. The logic of the node voltage V5 is WH, and the logic of the node voltage V6 is WL. Thus, from time point R3 to time point R4, the node voltages V1 to V6 of various portions of the device are unstable (that is, the inverters INV3 and INV4 do not perform logical inversion completely and thus their output logics are not secured to be "0"/"1").

At the next time point R4, the control signal E2 is changed to "1", and the first input terminals (1) of the multiplexers MUX1 and MUX2 are selected; thus the normal loop is formed in the loop structure portion LOOP. Along with this switching of the signal paths, the output terminal (logic: WH) of the inverter INV4 and the input terminal (logic: WH) of the inverter INV3 are connected to each other, and the output terminal (logic: WL) of the inverter INV3 and the input terminal (logic: WL) of the inverter INV4 are connected to each other. Thus, no mismatch occurs among signal logics (WH/WL) of the nodes, and from this time on, when the normal loop is formed in the loop structure portion LOOP, the inverter INV3 receives an input having a logic WL and tries to raise the logic of its output to "1", and the inverter INV4 receives an input having a logic WH, and tries to lower the logic of its output to "0". As a result, the logic of the output from the inverter INV3 is securely set to "0" instead of the unstable logic WL, and the logic of the output from the inverter INV4 is securely set to "1" instead of the unstable logic WH.

In this way, at time point R4, along with the normal loop being formed in the loop structure portion LOOP, a signal (a voltage difference between the node voltages V1 and V2) read out from the ferroelectric devices is amplified in the loop structure portion LOOP, and data ("1" in the example shown in FIG. 2) held before a shutdown is restored as the output signal Q.

Subsequently, at time point R5, the F reset signal FRST is changed to "1" again, the transistors Q1a, Q1b, Q2a, and Q2b are turned on, and the two ends of each of the ferroelectric devices CL1a, CL1b, CL2a, and CL2b are short circuited; thus, a state is achieved in which no voltage at all is applied to the ferroelectric devices CL1a, CL1b, CL2a, and CL2b. At this time, the first and second plate lines PL1 and PL2 are both "0". Thus, the data holding device is restored to a normal operation state, as before time point W1.

FIG. 5 is a circuit diagram showing a signal path (described as a thick line in the figure) in the data read-out operation (particularly from time point R3 to time point R4) described above.

As described above, the data holding device of this embodiment includes the loop structure portion LOOP that holds data by using logic gates (in FIG. 1, the inverters INV3 and INV4) that are connected in a loop, the non-volatile memory portion (CL1$a$, CL1$b$, CL2$a$, CL2$b$, Q1$a$, Q1$b$, Q2$a$, and Q2$b$) that stores data held by the loop structure portion LOOP, in a non-volatile manner, by using the hysteresis characteristic of ferroelectric devices, and the circuit separation portion (MUX1, MUX2, INV6, INV7, SW3, and SW4) that electrically separates the loop structure portion LOOP and the non-volatile memory portion, and, during a normal operation of the data holding device, the circuit separation portion electrically operates the loop structure portion LOOP, maintaining voltages applied to the ferroelectric devices constant.

By providing the data-writing drivers (in FIG. 1, the inverters INV6 and INV7) that also function as buffers, between signal lines of the loop structure portion LOOP and the ferroelectric devices CL1$a$, CL1$b$, CL2$a$, and CL2$b$ in this way, instead of driving the ferroelectric devices CL1$a$, CL1$b$, CL2$a$, and CL2$b$ directly from the signal lines of the loop structure portion LOOP, the ferroelectric devices CL1$a$, CL1$b$, CL2$a$, and CL2$b$ can be prevented from becoming load capacitors in the loop structure portion LOOP.

Furthermore, with the configuration in which the pass switches SW3 and SW4 are connected to the output terminals of the data writing drivers (the inverters INV6 and INV7) such that the pass switches SW3 and SW4 are turned on, according to the control signal E1, only when data writing operation is performed, the ferroelectric devices CL1$a$, CL1$b$, CL2$a$, and CL2$b$ can be prevented from being driven during a normal operation.

Moreover, when a data read-out operation is performed, electrical connection between the logic gates (in FIG. 1, the inverters INV3 and INV4) in the loop structure portion LOOP and the ferroelectric devices CL1$a$, CL1$b$, CL2$a$, and CL2$b$ can be made or broken by switching input/output paths of the multiplexers MUX1 and MUX2 according to the control signal E2. This eliminates the need of providing an additional heavy-load clock line to bring a specific node to a floating state, and as a result, an increase in power consumption can be avoided.

The control signals E1 and E2, which are newly required in the data holding device of this embodiment, hardly influence the power consumption of the data holding device, because these signals, unlike a clock signal that is constantly driven, are not driven at all during a normal operation.

The data writing drivers (the inverters INV6 and INV7) and the multiplexers MUX1 and MUX2, which need to be additionally provided in the data holding device of this embodiment, can be said to cause hardly any increase in the overall area of an operation circuit, because the data holding device often occupies merely a several percent of the area of an operation circuit such as a CPU (central processing unit).

Thus, with the data holding device of this embodiment, since the ferroelectric devices are not driven uselessly during the normal operation, a same level of operation speed as a volatile data holding device and low power consumption can be realized.

That is, the data holding device of this embodiment can be dealt with in the same manner as a volatile data holding device, and thus, a memory device portion of an existing circuit can be replaced with the data holding device of the present invention without redesigning timing or power consumption. Thus, an existing circuit can be easily non-volatilized, and this makes it possible to realize a CPU and the like capable of holding data after power is shut off during a standby period and restarting operation immediately after power is turned on.

Figure 6:
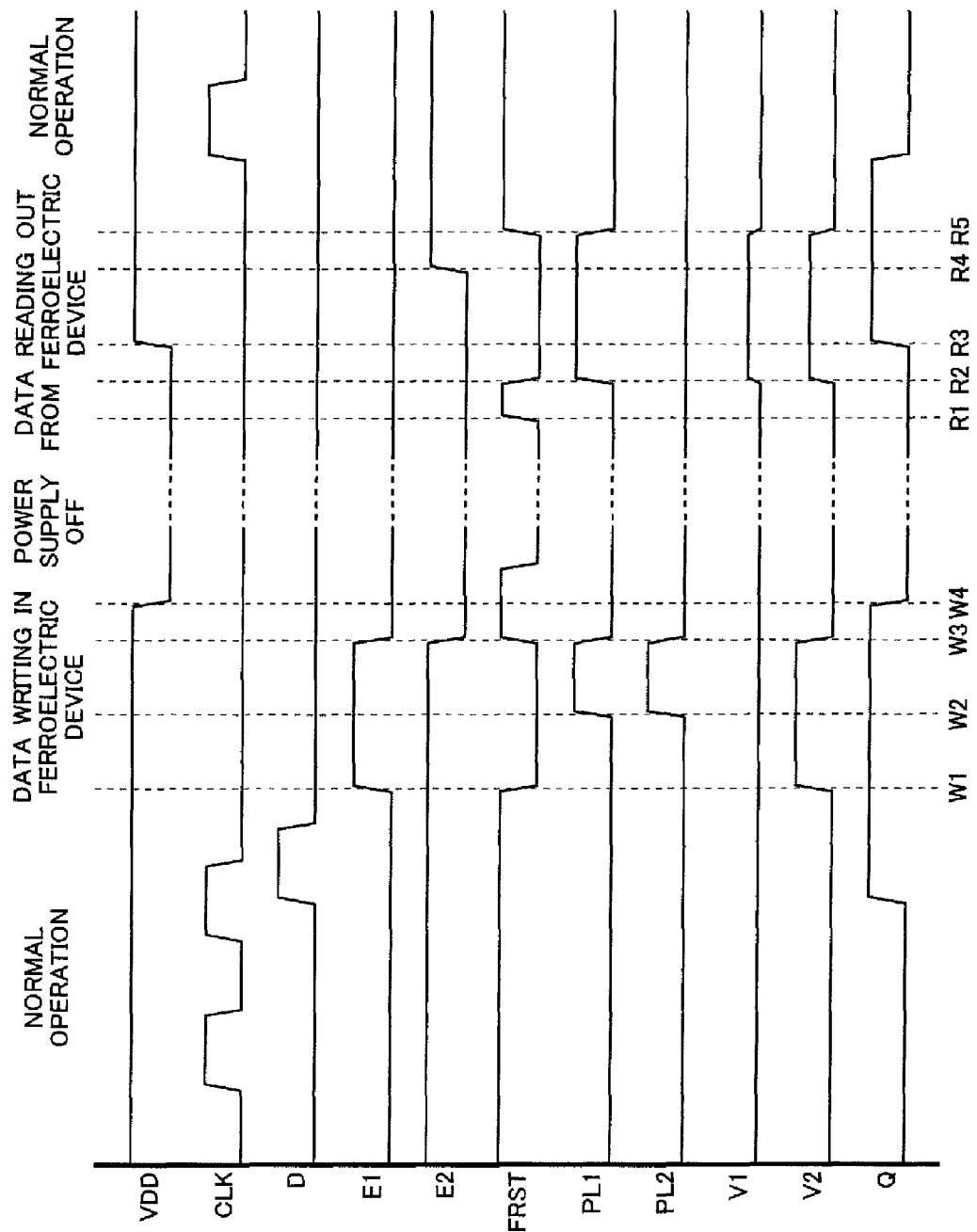
FIG. 6 is a timing chart for illustrating another example of an operation of a data holding device according to the present invention.

Next, a detailed description will be given of a modified example of the operation of reading out data from the ferroelectric devices, with reference to FIG. 6. FIG. 6 is a timing chart for illustrating another example of the operation of the data holding device according to the present invention. In the figure, there are shown voltage waveforms of the power supply voltage VDD, the clock signal CLK, the data signal D, the control signal E1, the control signal E2, the F reset signal FRST, the voltage applied to the first plate line PL1, the voltage applied to the second plate line PL2, the node voltage V1, the node voltage V2, and the output signal Q, from top to bottom in this order.

From time point R1 to time point R5, the clock signal CLK is "0", and the inverted clock signal CLKB is "1". Thus, the first pass switch SW1 is off, and the second pass switch SW2 is on. By fixing the clock signal CLK and the inverted clock signal CLKB to predetermined logics in this way, the operation of reading out data from the ferroelectric devices can be performed with enhanced stability.

At time point R1, the F reset signal FRST is changed to "1" first of all, the transistors Q1$a$, Q1$b$, Q2$a$, and Q2$b$ are turned on, and the two ends of each of the ferroelectric devices CL1$a$, CL1$b$, CL2$a$, and CL2$b$ are short circuited. Thus, since no voltage at all is applied to the ferroelectric devices CL1$a$, CL1$b$, CL2$a$, and CL2$b$, even at a voltage variation occurring when power is turned on, no unintentional voltage is applied to the ferroelectric devices CL1$a$, CL1$b$, CL2$a$, and CL2$b$, and this helps prevent damage to data.

At time point R1, the first and second plate lines PL1 and PL2 are "0 (low level)".

At time point R2, the F reset signal FRST is changed to "0", the transistors Q1$a$, Q1$b$, Q2$a$, and Q2$b$ are turned off, and a state is achieved in which voltages can be applied to the ferroelectric devices CL1$a$, CL1$b$, CL2$a$, CL2$b$. Meanwhile, the first plate line PL1 is changed to "1" with the second plate line PL2 maintained at "0". By applying the pulse voltages in this way, voltage signals corresponding to the states of remanent polarization in the ferroelectric devices appear as the node voltages V1 and V2.

Specifically, with reference to the example shown in FIG. 6, the logic of the node voltage V1 is WL, and the logic of the node voltage V2 is WH. That is, a voltage difference occurs between the node voltages V1 and V2, corresponding to the difference in remanent polarization state among the ferroelectric devices.

However, from time point R2 to time point R3, since the power supply voltage VDD is not supplied yet, the node voltages V3 to V6 of the parts of the loop structure portion LOOP are "0", and thus the output signal Q is "0".

At the next time point R3, the power supply voltage VDD is turned on, in a state in which the control signals E1 and E2 are both "0" (that is, in a state in which the data writing drivers are disabled and the normal loop is disabled in the loop structure portion LOOP). At this time, the signal line indicated by the thick line in FIG. 5 is in a floating state.

From time point R3 to time point R4, the control signal E2 is "0", and the second input terminals (0) of the multiplexers MUX1 and MUX2 are selected; thus the logic of the node voltage V3 is WL, and the logic of the node voltage V4 is WH. The logic of the node voltage V5 is WH, and the logic of the node voltage V6 is WL. In this way, from time point R3 to time point R4, the node voltages V1 to V6 of various portions of the device are unstable (that is, the inverters INV3 and INV4 do not perform logical inversion completely and thus their output logics are not secured to be "0"/"1").

At the next time point R4, the control signal E2 is changed to "1", and the first input terminals (1) of the multiplexers MUX1 and MUX2 are selected, and thus the normal loop is formed in the loop structure portion LOOP. Along with this switching of the signal paths, the output terminal (logic: WH) of the inverter INV4 and the input terminal (logic: WH) of the inverter INV3 are connected to each other, and the output terminal (logic: WL) of the inverter INV3 and the input terminal (logic: WL) of the inverter INV4 are connected to each other. Thus, no mismatch occurs among signal logics (WH/WL) of the nodes, and from this time on, when the normal loop is formed in the loop structure portion LOOP, the inverter INV3 receives an input having a logic WL and tries to raise the logic of its output to "1", and the inverter INV4 receives an input having a logic WH, and tries to lower the logic of its output to "0". As a result, the logic of the output from the inverter INV3 is securely set to "0" instead of the unstable logic WL, and the logic of the output from the inverter INV4 is securely set to "1" instead of the unstable logic WH.

Thus, at time point R4, along with the normal loop being formed in the loop structure portion LOOP, a signal (a voltage difference between the node voltages V1 and V2) read out from the ferroelectric devices is amplified in the loop structure portion LOOP, and data ("1" in the example of FIG. 6) held before a shutdown is restored as the output signal Q.

Then, at time point R5, the F reset signal FRST is changed to "1" again, the transistors Q1a, Q1b, Q2a, and Q2b are turned on, and the two ends of each of the ferroelectric devices CL1a, CL1b, CL2a, and CL2b are short circuited. Thus, a state is achieved in which no voltage at all is applied to the ferroelectric devices CL1a, CL1b, CL2a, and CL2b. At this time, the first and second plate lines PL1 and PL2 are "0". Thus, the data holding device is restored to a normal operation state in which the data holding device is before time point W1.

As described above, in the data read-out operation shown in FIG. 6, as distinct from in the data read-out operation shown in FIG. 2, the operation of extracting voltage signals (the node voltages V1 and V2) corresponding to the states of remanent polarization in the ferroelectric devices is started before the power supply voltage VDD is turned on. This makes it possible to reduce the number of operation steps after the power supply voltage VDD is turned on (while three steps (time points R3, R4, R5) are necessary in the operation example shown in FIG. 2, only two steps (time points R4 and R5) are necessary in the operation example shown in FIG. 6), and thus the time necessary for the data holding device to be restored to the normal operation state can be reduced.

Next, a detailed description will be given of characteristics of the ferroelectric devices used in the data holding device of this embodiment.

Figure 7:
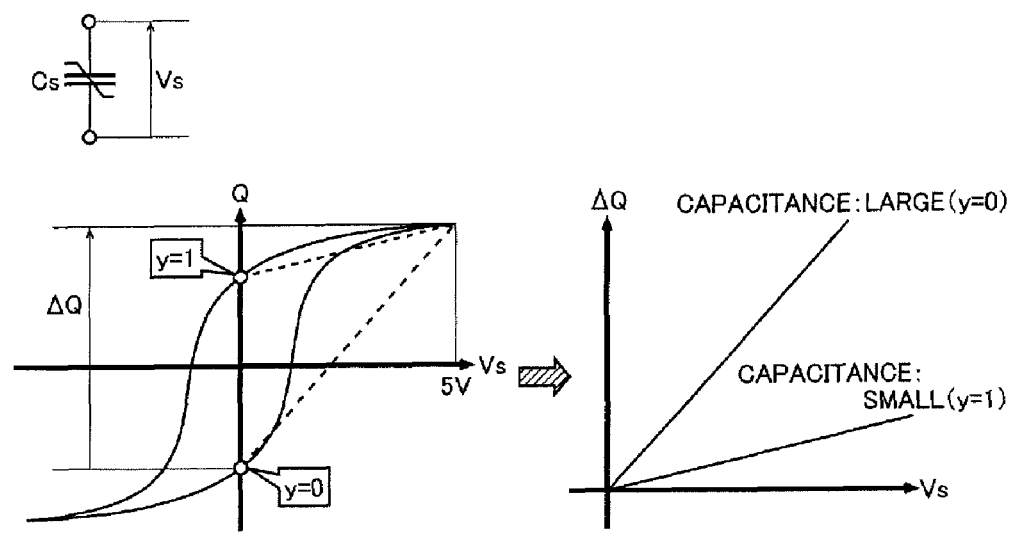
FIG. 7 is a diagram for illustrating a characteristic of a ferroelectric device.

FIG. 7 is a diagram for illustrating a characteristic of a ferroelectric device. The upper diagram in FIG. 7 schematically shows how a voltage Vs is applied to a ferroelectric device Cs. The lower left diagram in FIG. 7 shows the hysteresis characteristic of the ferroelectric device Cs, and the lower right diagram in FIG. 7 illustrates the capacitance characteristic of the ferroelectric device Cs.

As shown in the figure, the capacitance characteristic of the ferroelectric device Cs changes according to the state of remanent polarization when the voltage Vs is applied between the two ends of the ferroelectric device Cs. Specifically, the capacitance of the ferroelectric device Cs is reduced when a positive voltage Vs is applied between the two ends of the ferroelectric device Cs, and the ferroelectric device Cs is brought into a non-inversion state (y=1). In contrast, the capacitance of the ferroelectric device Cs is increased when a negative voltage Vs is applied between the two ends of the ferroelectric device Cs, and the ferroelectric device Cs is brought into an inversion state (y=0). Thus, in reading out data stored in the ferroelectric device Cs, the just-described difference in capacitance needs to be converted into a voltage value.

To achieve this, the data holding device of this embodiment uses capacitive coupling between a ferroelectric device in a non-inversion state (y=1) and a ferroelectric device in an inversion state (y=0) in reading out data from the non-volatile memory portion.

FIG. 8 is a diagram for illustrating a data reading-out method by using capacitive coupling between ferroelectric devices. In FIG. 8, the upper diagrams show the state in which the ferroelectric device CL1a (the ferroelectric device CL2a) is in an inversion state (y=0) and the ferroelectric device CL1b (the ferroelectric device CL2b) is in a non-inversion state (y=1), and the capacitance characteristic in this state, whereas the lower diagrams show the state in which the ferroelectric device CL1a (the ferroelectric device CL2a) is in a non-inversion state (y=1) and the ferroelectric device CL1b (the ferroelectric device CL2b) is in an inversion state (y=0), and the capacitance characteristic in this state.

As already mentioned, in a data writing operation with respect to the ferroelectric devices, the ferroelectric devices CL1a and CL1b have opposite remanent polarization states, and the ferroelectric devices CL2a and CL2b also have opposite remanent polarization states. Thus, the capacitance characteristic is such that, in each pair of the ferroelectric devices, the larger the capacitance of one ferroelectric device is, the smaller the capacitance of the other ferroelectric device is.

Thus, the amplitude value of the read-out voltage Vout can be ensured to be close to 1V to significantly improve reading-out margin with the following configuration. That is, a pair of the ferroelectric devices CL1a and CL1b having opposite remanent polarization states are connected in series, a pair of the ferroelectric devices CL2a and CLK2b having opposite remanent polarization states are connected in series, and the node voltages V1 and V2 (voltages determined by capacitance ratios and denoted as the read-out voltage Vout in FIG. 8) that appear at the connection nodes between the ferroelectric devices CL1a and CL1b and between the ferroelectric devices CL2a and CLK2b, respectively, when a pulse voltage is applied to one end of each of the pairs of the serially connected ferroelectric devices are detected.

Also, with the data holding device of this embodiment, which is configured such that 0/1 determination of data read out from the non-volatile memory portion (determination as to whether the data is "0" or "1") is performed by comparing the node voltage V1 corresponding to the capacitance ratio between the ferroelectric devices CL1a and CL1b with the node voltage Vb corresponding to the capacitance ratio between the ferroelectric devices CL2a and CL2b, there is no need of strictly setting the threshold values of the inverters.

Figure 9:
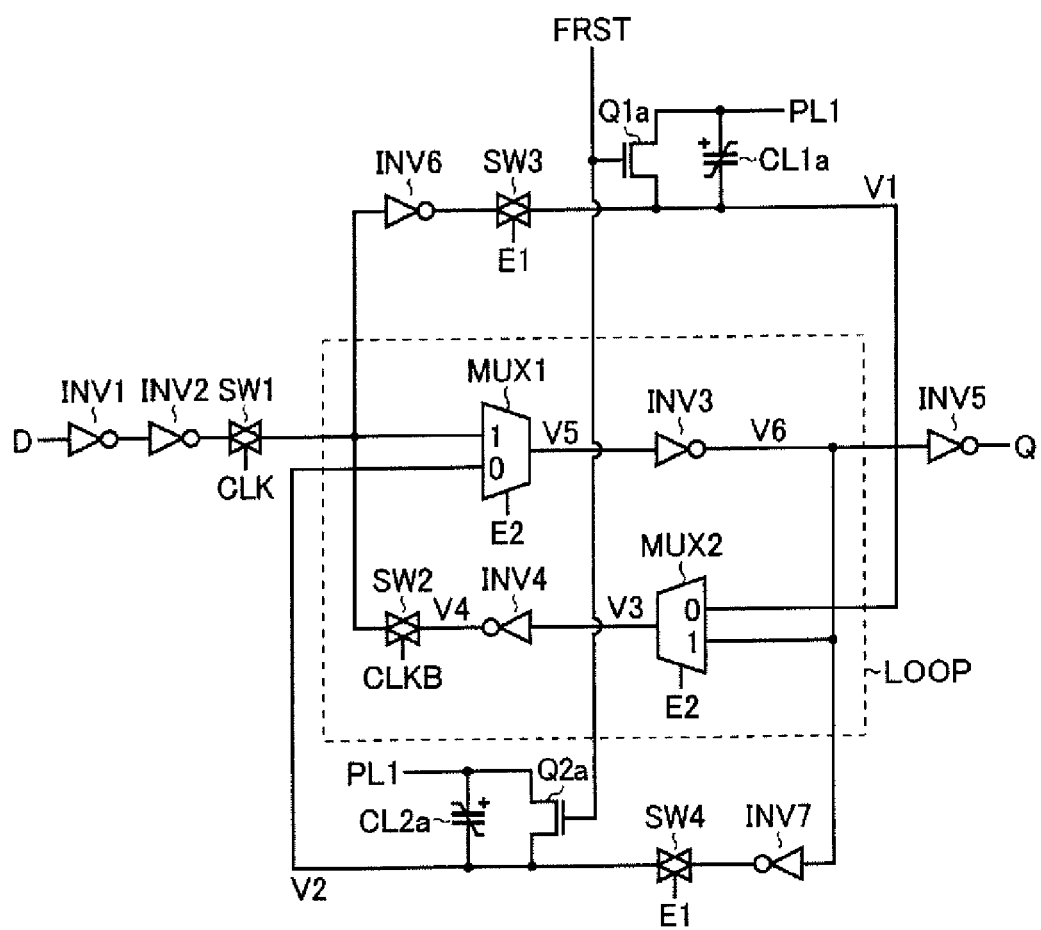
FIG. 9 is a circuit diagram showing a first modified example of a data holding device according to the present invention.
Figure 10:
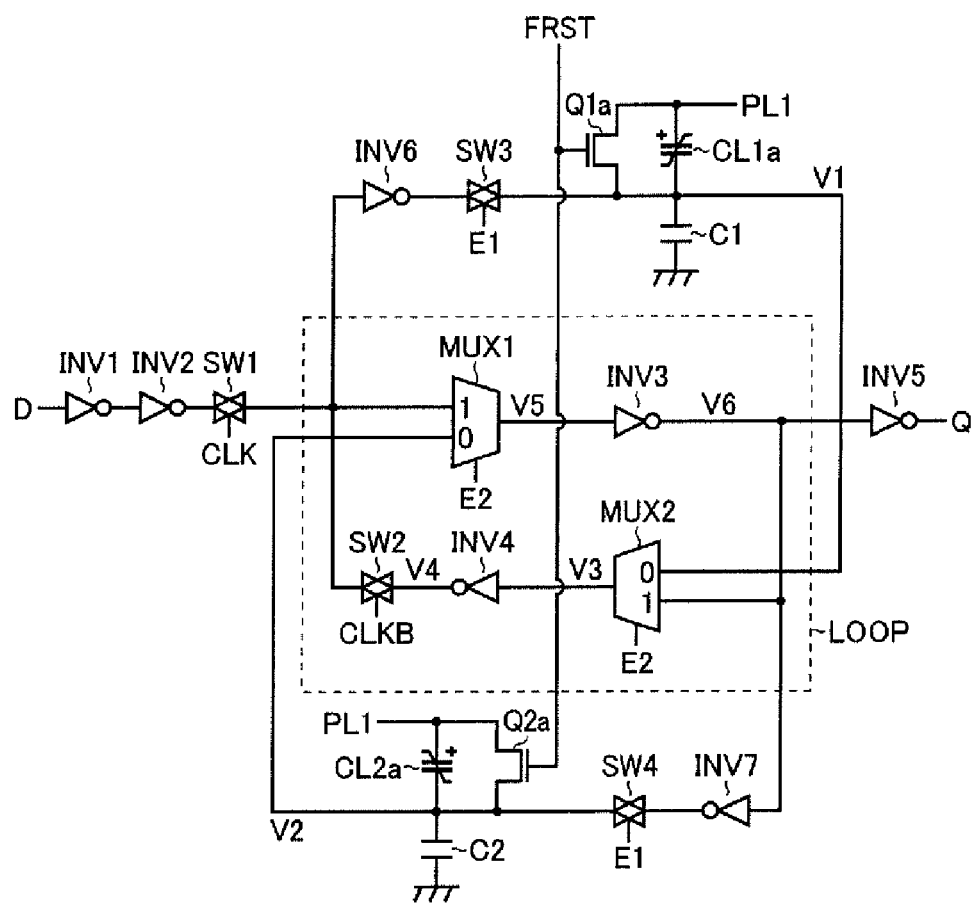
FIG. 10 is a circuit diagram showing a second modified example of a data holding device according to the present invention.

The data holding device of this embodiment adopts data reading-out method using capacitive coupling between ferroelectric devices in this way, but this is not meant to limit the configuration of the present invention. As shown in FIG. 9 (a first modified example), the data holding device may be configured such that data is read out by using capacitive coupling between the ferroelectric devices CL1a, CL2a and gate capacitances of transistors constituting the inverters INV3, INV4 (in other words, configuration obtained by omitting the ferroelectric devices CL1b and CL2b and the transistors Q1b and C2b). Or, as shown in FIG. 10 (a second modified example), the data holding device may be configured such that data is read out by using capacitive coupling between the ferroelectric devices CL1a, CL1b and other capacitors C1, C2.

Figure 11:
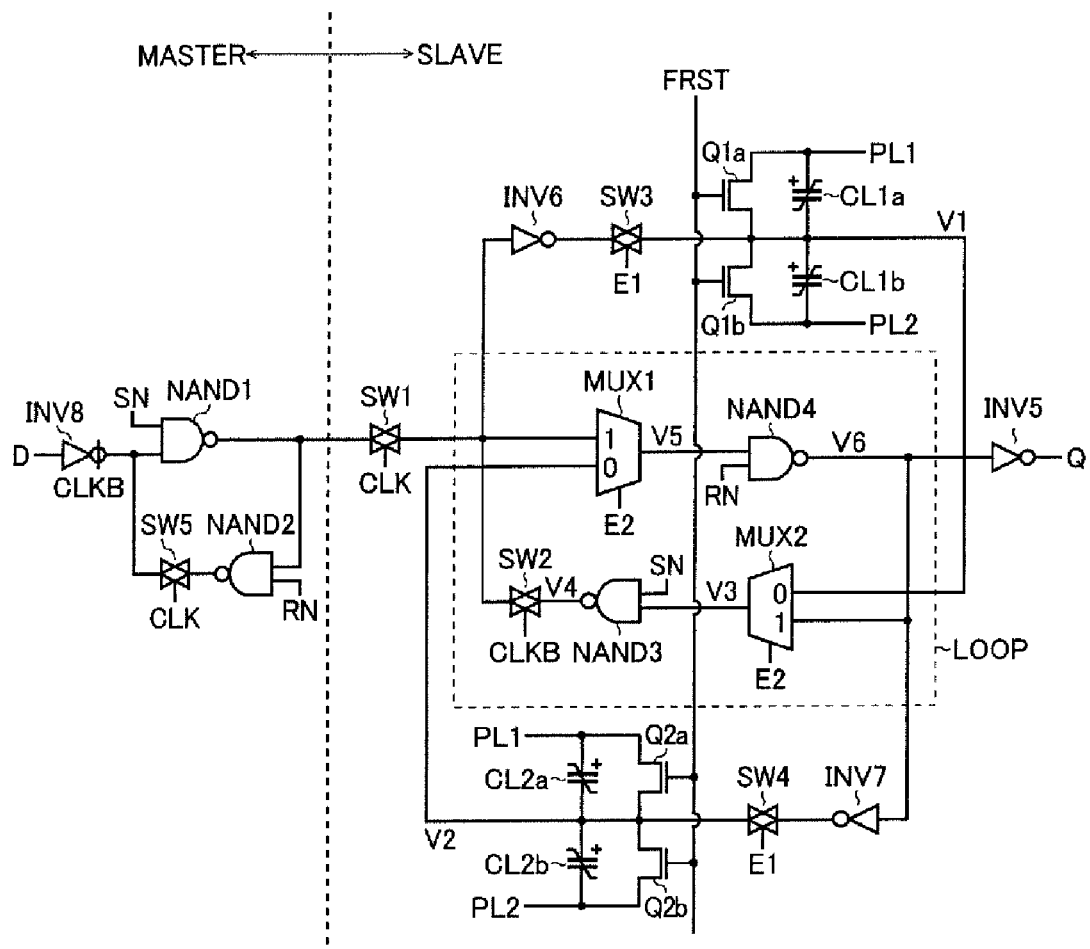
FIG. 11 is a circuit diagram showing an example in which the present invention is applied to a D-type flip-flop.

FIG. 11 is circuit diagram showing an example in which the present invention is applied to a D-type flip-flop (register).

As shown in the figure, in forming a D-type flip flop, two stages of latch circuits (a master latch circuit and a slave latch circuit) are connected in series; here, it is not necessary to make both the master and slave latch circuits non-volatile, and it is sufficient to apply the present invention only to the slave latch circuit.

Figure 12:
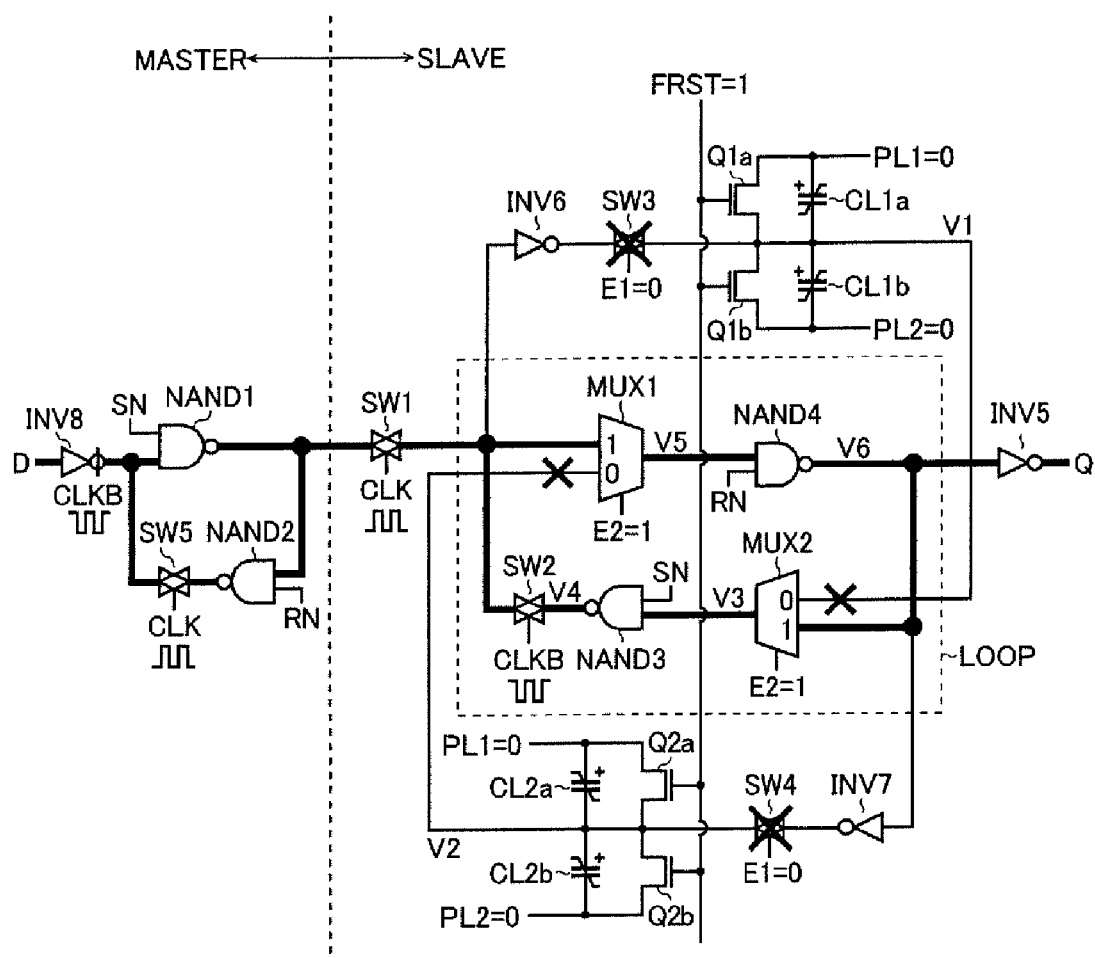
FIG. 12 is a circuit diagram showing a signal path in a normal operation.
Figure 13:
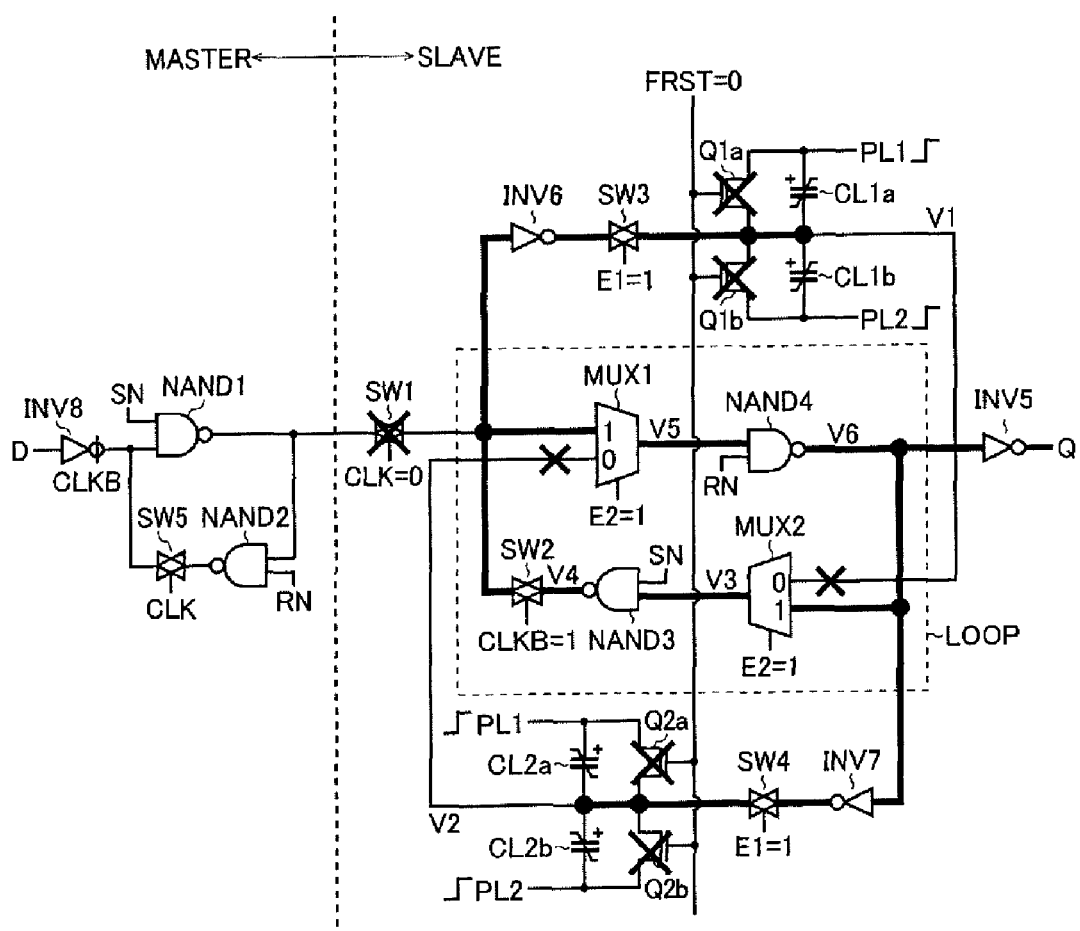
FIG. 13 is a circuit diagram showing a signal path in a data writing operation.
Figure 14:
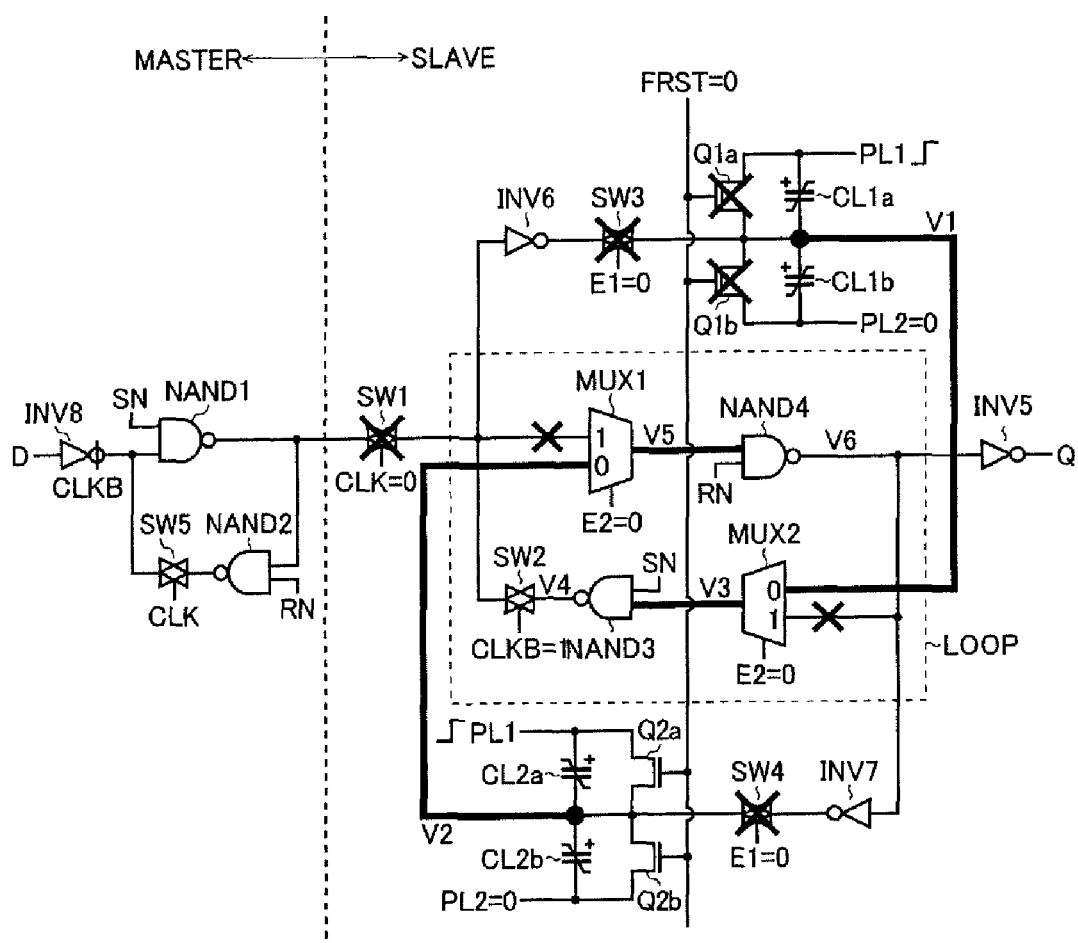
FIG. 14 is a circuit diagram showing a signal path in a data read-out operation.

A normal operation, a data writing operation for writing data in the ferroelectric devices, and a data read-out operation for reading out data from the ferroelectric devices are performed in the same manner as described above except that the master-side latch circuit is connected. And as shown in FIGS. 12 to 14, overlapping descriptions of the signal paths in these operations are unnecessary.

However, in the D-type flip-flop shown in the figure, NAND operation units NAND1 to NAND4 are used, instead of the inverters, as the logic gates forming the loop structure portion, to realize a set/reset function. When set signals RN inputted to the NAND operation units NAND1 and NAND3 are "0", the output signal Q is forced to be "1", and, when reset signals SN supplied to the NAND operation units NAND2 and NAND4 are "0", the output signal Q is forced to be "0". Thus, in the data writing operation and in the data read-out operation, the set signals RN and the reset signals SN need to be set to "1".

Figure 15:
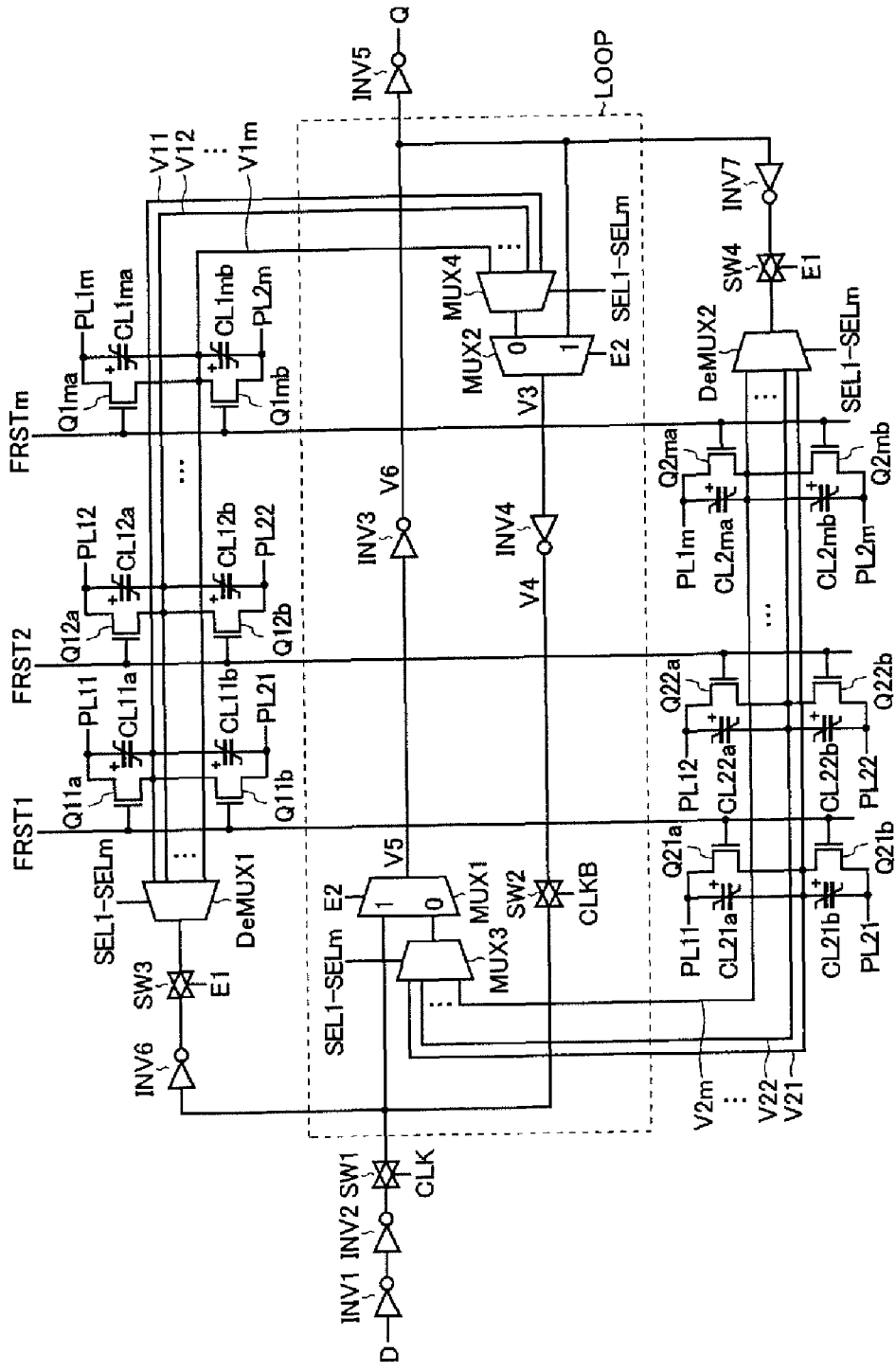
FIG. 15 is a circuit diagram showing a third modified example of a data holding device according to the present invention.

Next, a third modified example of the display device according to the present invention will be described in detail with reference to FIG. 15. FIG. 15 is a circuit diagram showing the third modified example of a data holding device according to the present invention.

The data holding device shown in this figure is a latch circuit having: inverters INV1 to INV7; pass switches SW1 to SW4; multiplexers MUX1 to MUX4; demultiplexers DeMUX1 and DeMUX2; N-channel field effect transistors Q11a to Q1ma, Q11b to Q1mb, Q21a to Q2ma, and Q21b to Q2mb; and ferroelectric devices (ferroelectric capacitors) CL11a to CL1ma, CL11b to CL1mb, CL21a to CL2ma, and CL21b to CL2mb.

An input terminal of the inverter INV1 is connected to a data signal (D) application terminal. An output terminal of the inverter INV1 is connected to an input terminal of the inverter INV2. An output terminal of the inverter INV2 is connected via the pass switch SW1 to a first input terminal (1) of the multiplexer MUX1. An output terminal of the multiplexer MUX1 is connected to an input terminal of the inverter INV3. An output terminal of the inverter INV3 is connected to an input terminal of the inverter INV5. An output terminal of the inverter INV5 is connected to an output signal (Q) extraction terminal. A first input terminal (1) of the multiplexer MUX2 is connected to the output terminal of the inverter INV3. An output terminal of the multiplexer MUX2 is connected to an input terminal of the inverter INV4. An output terminal of the inverter INV4 is connected via the pass switch SW2 to the first input terminal (1) of the multiplexer MUX1.

Thus, the data holding device of this embodiment has a loop structure portion LOOP (the portion surrounded by the broken line in the figure) that holds an inputted data signal D by using two logic gates (in FIG. 15, the inverters INV3 and INV4) that are connected in a loop.

An input terminal of the inverter INV6 is connected to the first input terminal (1) of the multiplexer MUX1. An output terminal of the inverter INV6 is connected via the pass switch SW3 to an input terminal of the demultiplexer DeMUX1. First to "m"th output terminals of the demultiplexer DeMUX1 are connected to first to "m"th input terminals, respectively, of the multiplexer MUX4. An output terminal of the multiplexer MUX4 is connected to a second input terminal (0) of the multiplexer MUX2.

An input terminal of the inverter INV7 is connected to the first input terminal (1) of the multiplexer MUX2. An output terminal of the inverter INV7 is connected via the pass switch SW4 to an input terminal of the demultiplexer DeMUX2. First to "m"th output terminals of the demultiplexer DeMUX2 are connected to first to "m"th input terminals, respectively, of the multiplexer MUX3. An output terminal of the multiplexer MUX3 is connected to a second input terminal (0) of the multiplexer MUX1.

Positive ends of the ferroelectric devices CL11a to CL1ma are connected to plate lines PL11 to PL1m, respectively. Negative ends of the ferroelectric devices CL11a to CL1ma are connected to the first to "m"th output terminals, respectively, of the demultiplexer DeMUX1. Between two ends of the ferroelectric devices CL11a to CL1ma, the transistors Q11a to Q1ma are connected, respectively. Gates of the transistors Q11a to Q1ma are connected to application terminals of F reset signals FRST1 to FRSTm, respectively.

Positive ends of the ferroelectric devices CL11b to CL1mb are connected to the first to "m"th output terminals, respectively, of the demultiplexer DeMUX1. Negative ends of the ferroelectric devices CL11b to CL1mb are connected to plate lines PL21 to PL2m, respectively. Between two ends of the ferroelectric devices CL11b to CL1mb, the transistors Q11b to Q1mb are connected, respectively. Gates of the transistors Q11b to Q1mb are connected to the application terminals of the F reset signals FRST1 to FRSTm, respectively.

Positive ends of the ferroelectric devices CL21a to CL2ma are connected to the plate lines PL11 to PL1m, respectively. Negative ends of the ferroelectric devices CL21a to CL2ma are connected to the first to "m"th output terminals, respectively, of the demultiplexer DeMUX2. Between two ends of the ferroelectric devices CL21a to CL2ma, the transistors Q21a to Q2ma are connected, respectively. Gates of the transistors Q21a to Q2ma are connected to the application terminals of the F reset signals FRST1 to FRSTm, respectively.

Positive ends of the ferroelectric devices CL21b to CL2mb are connected to the first to "m"th output terminals, respectively, of the demultiplexer DeMUX2. Negative ends of the ferroelectric devices CL21b to CL2mb are connected to plate lines PL21 to PL2m, respectively. Between two ends of the ferroelectric devices CL21b to CL2mb, the transistors Q21b to Q2mb are connected, respectively. Gates of the transistors Q21b to Q2mb are connected to the application terminals of F reset signals FRST1 to FRSTm, respectively.

Among the components described above, the pass switch SW1 is turned on/off according to a clock signal CLK, and the pass switch SW2 is turned on/off according to an inverted clock signal CLKB (a logic inverted signal of the clock signal CLK whose logic is inverse to that of the clock signal CLK). That is, the pass switches SW1 and SW2 are turned on/off exclusively (complementarily) to each other. On the other hand, the pass switches SW3 and SW4 are both turned on/off according to a control signal E1. Signal paths with respect to the multiplexers MUX1 and MUX2 are selected according to a control signal E2. Signal paths with respect to the multiplexers MUX3 and MUX4 and the demultiplexers DeMUX1 and DeMUX2 are selected according to control signals SEL1 to SELm.

That is, the data holding device having the above configuration is obtained by expanding the configuration shown in FIG. 1 so as to accommodate "m" bits (m≧2) of the data D, and the data holding device has first to "m"th memory regions that can be selected according to the control signals SEL1 to SELm. Referring to the example shown in FIG. 15, an "x"th memory region (1≦x≦m) is formed of the ferroelectric devices CL1xa, CL1xb, CL2xa, and CL2xb, and transistors Q1xa, Q1xb, Q2xa, and Q2xb. However, this is not meant to limit the configuration of the present invention, and the modifications shown in FIGS. 9 and 10, which are referred to above, can also be performed.

Next, a detailed description will be given of an operation of the data holding device configured as described above. In the descriptions below, node voltages will be denoted by symbols in the following manner: voltages appearing at the first to "m"th output terminals of the demultiplexer DeMUX1 (the first to "m"th input terminals of the multiplexer MUX4) are V11 to V1m, respectively, voltages appearing at the first to "m"th output terminals of the demultiplexer DeMUX2 (the first to "m"th input terminals of the multiplexer MUX3) are V21 to V2m, respectively, a voltage appearing at the input terminal of the inverter INV4 is V3; a voltage appearing at the output terminal of the inverter INV4 is V4; a voltage appearing at the input terminal of the inverter INV3 is V5; and a voltage appearing at the output terminal of the inverter INV3 is V6.

Figure 16:
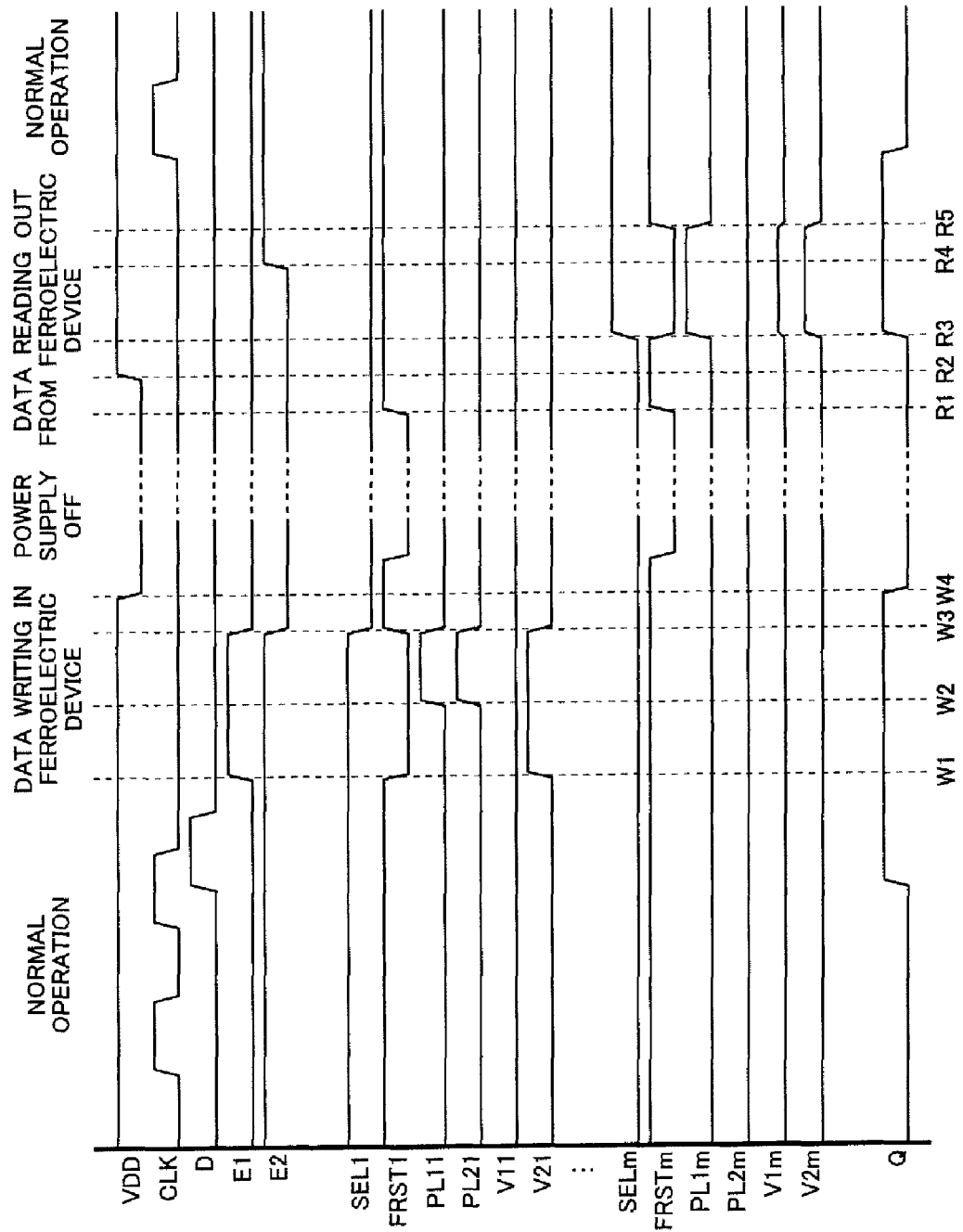
FIG. 16 is a timing chart for illustrating an example of an operation of a data holding device according to the present invention.

FIG. 16 is a timing chart for illustrating an example of the operation (operation of writing data D in the first memory region and reading out data D from the "m"th memory region) of the data holding device according to the present invention. In the figure, there are shown voltage waveforms of the power supply voltage VDD, the clock signal CLK, the data signal D, the control signal E1, the control signal E2, the control signal SEL1, the F reset signal FRST1, the voltage applied to the first plate line PL11, the voltage applied to the plate line PL21, the node voltage V11, the node voltage V21, the control signal SELm, the F reset signal FRSTm, the voltage applied to the plate line PL1m, the voltage applied to the plate line PL2m, the node voltage V1m, the node voltage V2m, and the output signal Q, from top to bottom in this order.

In the data D writing operation, The control signal SELy, the F reset signal FRSTy, the voltage applied to the plate line PL1y, the voltage applied to the plate line PL2y, the node voltage V1y, and the node voltage V2y related to a "y"th memory region (1<y<m) that is not selected as a memory region in which the data D is to be written or from which the data D is to be read out are the same, in the data D writing operation, as those in the "m"th region that is not selected as a memory region in which the data D is to be written, and are the same, in the data D read-out operation, as those in the first memory region that is not selected as a memory region from which the data D is to be read out. Thus, descriptions of them will be omitted whenever possible.

First, the normal operation of the data holding device will be described.

Until time point W1, the F reset signals FRST1 to FRSTm are all "1 (high level)", the transistors Q11a to Q1ma, Q11b to Q1mb, Q21a to Q2ma, and Q21b to Q2mb are all on, and two ends of each of the ferroelectric devices CL11a to CL1ma, CL11b to CL1mb, CL21a to CL2ma, and CL21b to CL2mb are all short circuited. Thus, a state is achieved in which no voltage at all is applied to the ferroelectric devices CL11a to CL1ma, CL11b to CL1mb, CL21a to CL2ma, and CL21b to CL2mb. Incidentally, the plate lines PL11 and PL1m and the plate lines PL21 to PL2m are all "0 (low level)".

Also, until time point W1, the control signal E1 is "0", and the pass switches SW3 and SW4 are off; thus data writing drivers (the inverters INV6 INV7 in the example shown in FIG. 15) are disabled.

Also, until time point W1, the control signal E2 is "1" and the first input terminals (1) of the multiplexers MUX1 and MUX2 are selected; thus a normal loop is formed in the loop structure portion LOOP.

Thus, during a high-level period of the clock signal CLK, the pass switch SW1 is on and the pass switch SW2 is off; thus the data signal D passes as it is as the output signal Q. On the other hand, during a low-level period of the clock signal CLK1, the pass switch SW1 is off and the pass switch SW2 is on; thus the data signal D is latched at a falling edge of the clock signal CLK.

Next, the operation of writing data in the first memory region will be described.

From time point W1 to W3, the clock signal CLK is "0", and the inverted clock signal CLKB is "1". Thus, the first pass switch SW1 is off, and the second pass switch SW2 is on. By fixing the clock signal CLK and the inverted clock signal CLKB to predetermined logics in this way, the operation of writing data in the ferroelectric devices can be performed with enhanced stability.

Also, from time point W1 to time point W3, the control signal SEL1 is "1", and the other control signals SEL2 to SELm are "0" so as to select the first memory region as a memory region in which the data D is to be written. As a result, a state is achieved in which a signal path connecting the input terminal and the first output terminal is selected with respect to each of the demultiplexers DeMUX1 and DeMUX2, and a signal path connecting the output terminal and the first input terminal is selected with respect to each of the multiplexers MUX3 and MUX4.

Also, from time point W1 to time point W3, the F reset signal FRST1 is "0" and the transistors Q11a, Q11b, Q21a, and Q21b are off; thus a state is achieved in which voltages can be applied to the ferroelectric devices CL11a, CL11b, CL21a, and CL21b.

On the other hand, the F reset signals FRST2 to FRSTm continue to be maintained at "1", damage to data can be prevented from occurring in the second to "m"th memory regions.

Also, from time point W1 to time point W3, the control signal E1 is "1", and the pass switches SW3 and SW4 are on. Thus, the data writing drivers (the inverters INV6 and INV7 in the example shown in FIG. 15) are enabled.

The control signal E2, which is "1" in a period before time point W1, is also "1" from time point W1 to W3, and the first input terminals (1) of the multiplexers MUX1 and MUX2 are selected; thus the normal loop is formed in the loop structure portion LOOP.

From time point W1 to time point W2, the plate lines PL11 and PL 21 are "0", and from time point W2 to time point W3, the plate lines PL11 and PL 21 are "1". That is, a same pulse voltage is applied to the plate lines PL11 and PL21. By applying the pulse voltages in this way, the states of remanent polarization in the ferroelectric devices are set either to the inversion or non-inversion state.

Specifically, with reference to the example shown in FIG. 16, at time point W1, the output signal Q is "1", and thus the node voltage V1 is "0" and the node voltage V2 is "1". Thus, from time point W1 to time point W2, during which the plate lines PL11 and PL21 are "0", a state is achieved in which no voltage is applied between the two ends of each of the ferroelectric devices CL11a and CL11b, a negative voltage is applied between the two ends of the ferroelectric device CL21a, and a positive voltage is applied between the two ends of the ferroelectric device CL21b. On the other hand, from time point W2 to time point W3, during which the plate lines PL11 and PL21 are "1", a state is achieved in which no voltage is applied between the two ends of each of the ferroelectric devices CL21a and CL21b, a positive voltage is applied between the two ends of the ferroelectric device CL11a, and a negative voltage is applied between the two ends of the ferroelectric device CL11b.

By applying the pulse voltages to the plate lines PL11 and PL21 in this way, the states of remanent polarization inside the ferroelectric devices are set either to the inversion or non-inversion state. The ferroelectric devices CL11a and CL11b have opposite remanent polarization states, and the ferroelectric devices CL21a and CL21b also have opposite remanent polarization states. Also, the ferroelectric devices CL11a and CL21a have opposite remanent polarization states, and the ferroelectric devices CL11b and CL21b have opposite remanent polarization states.

From time point W1 to time point W3, the plate lines PL12 to PL1m and the plate lines PL22 to PL2m are all "0".

At time point W3, the F reset signal FRST1 is changed to "1" again, the transistors Q11a, Q11b, Q21a, and Q21b are turned on, and the two ends of each of the ferroelectric devices CL11a, CL11b, CL21a, and CL21b are short circuited. Thus, no voltage at all is applied to the ferroelectric devices CL11a, CL11b, CL21a, and CL21b. At this time, the plate lines PL11 and PL21 are both "0". The control signal SEL1 is also "0".

Also, at time point W3, the control signal E1 is changed to "0" again, and the pass switches SW3 and SW4 are turned off, and thus the data writing drivers (the inverters INV6 and INV7 in the example shown in FIG. 15) are disabled. Incidentally, the control signal E2, which is not discussed here, is "0" in the example shown in FIG. 16.

Also, at time point W3, the F reset signals FRST2 to RFSTm are all maintained at "1", and the control signals SEL2 to SELm, the plate lines PL12 to PL1m, and PL22 to PL2m are all maintained at "0".

Then, at time point W4, the power supply voltage VDD is shut off. At this time, the F reset signals FRST1 to FRSTm, which are "1" before the power supply voltage VDD is shut off, is maintained at "1", the transistors Q11a to Q1ma, Q11b to Q1mb, Q21a to Q2ma, and Q21b to Q2mb are turned on, and the two ends of each of the ferroelectric devices CL11a to CL1ma, CL11b to CL1mb, CL21a to CL2ma, and CL21b to CL2mb are short circuited. As a result, a state is achieved in which no voltage at all is applied to the ferroelectric devices CL11a to CL1ma, CL11b to CL1mb, CL21a to CL2ma, and CL21b to CL2mb, and thus no unintentional voltage is applied to the ferroelectric devices CL11a to CL1ma, CL11b to CL1mb, CL21a to CL2ma, and CL21b to CL2mb even at a voltage variation occurring at a shutdown, and this helps prevent damage to data.

Next, a description will be given of an operation of reading out data from the "m"th memory region.

From time point R1 to time point R5, the clock signal CLK is "0", and the inverted clock signal CLKB is "1". Thus, the first pass switch SW1 is off, and the second pass switch SW2 is on. By fixing the clock signal CLK and the inverted clock signal CLKB to predetermined logics in this way, the operation of reading out data from the ferroelectric devices can be performed with enhanced stability.

At time point R1, all the F reset signals FRST1 to FRSTm are changed to "1" first of all, the transistors Q11a to Q1ma, Q11b to Q1mb, Q21a to Q2ma, and Q21b to Q2mb are turned on, and the two ends of each of the ferroelectric devices CL11a to CL1ma, CL11b to CL1mb, CL21a to CL2ma, and CL21b to CL2mb are short circuited. Thus, since a state is achieved in which no voltage at all is applied to the ferroelectric devices CL11a to CL1ma, CL11b to CL1mb, CL21a to CL2ma, and CL21b to CL2mb, no unintentional voltage is applied to the ferroelectric devices CL11a to CL1ma, CL11b to CL1mb, CL21a to CL2ma, and CL21b to CL2mb even at a voltage variation occurring when power is turned on, and this helps prevent damage to data.

At time point R1, the plate lines PL11 to PL1m and the plate lines PL21 to PL2m are all "0 (low level)".

At time point R2, when the control signals E1 and E2 are both "0" (that is, in a state in which the data writing drivers are disabled and the normal loop is disabled in the loop structure portion LOOP), the power supply voltage VDD is turned on.

At the next time point R3, the control signal SELm is changed to "1", and the other control signals SEL1 to SEL(m−1) are "0" so as to select the "m"th memory region as a memory region from which the data D is to be read out. As a result, a state is achieved in which a signal path connecting the input terminal and the "m"th output terminal is selected with respect to each of the demultiplexers DeMUX1 and DeMUX2, and a signal path connecting the output terminal and the "m"th input terminal is selected with respect to each of the multiplexers MUX3 and MUX4.

Also, at time point R3, the F reset signal FRSTm is changed to "0" to turn off the transistors Q1ma, Q1mb, Q2ma, and Q2mb, and a state is achieved in which voltages can be applied to the ferroelectric devices CL1ma, CL1mb, CL2ma, and CL2mb. Meanwhile, the plate line PL1m is changed to "1" with the plate line PL2m maintained at "0". By applying the pulse voltages in this way, voltage signals corresponding to the states of remanent polarization in the ferroelectric devices appear as the node voltages V1m and V2m.

Specifically, with reference to the example shown in FIG. 16 (a case in which the data D whose logic is "1" is accommodated in the third memory region), the logic of the node voltage V1m is WL, and the logic of the node voltage V2m is WH. That is, a voltage difference occurs between the node voltages V1m and V2m, corresponding to the difference in remanent polarization state among the ferroelectric devices.

From time point R3 to time point R4, the control signal E2 is "0", and the second input terminals (0) of the multiplexers MUX1 and MUX2 are selected; thus the logic of the node voltage V3 is WL, and the logic of the node voltage V4 is WH. The logic of the node voltage V5 is WH, and the logic of the node voltage V6 is WL. In this way, from time point R3 to time point R4, the node voltages V1m, V2m, and V3 to V6 of various portions of the device are in an unstable state (that is, the inverters INV3 and INV4 do not perform logical inversion completely and thus their output logics are not secured to be "0"/"1").

At time point R3, the F reset signals FRST1 to RFST(m−1) are all maintained at "1", and the control signals SEL1 to SEL(m−1), the plate lines PL11 to PL1(m−1), and PL21 to PL2(m−1) are all maintained at "0".

At the next time point R4, the control signal E2 is changed to "1", and the first input terminals (1) of the multiplexers MUX1 and MUX2 are selected; thus a normal loop is formed in the loop structure portion LOOP. Along with this switching of the signal paths, the output terminal (logic: WH) of the inverter INV4 and the input terminal (logic: WH) of the inverter INV3 are connected to each other, and the output terminal (logic: WL) of the inverter INV3 and the input terminal (logic: WL) of the inverter INV4 are connected to each other. Thus, no mismatch occurs among signal logics (WH/WL) of the nodes, and thereafter, during a period in which the normal loop is formed in the loop structure portion LOOP, the inverter INV3 receives an input having a logic WL and tries to raise the logic of its output to "1", and the inverter INV4 receives an input having a logic WH, and tries to lower the logic of its output to "0". As a result, the logic of the output from the inverter INV3 is securely set to "0" instead of the unstable logic WL, and the logic of the output from the inverter INV4 is securely set to "1" instead of the unstable logic WH.

Thus, at time point R4, along with the normal loop being formed in the loop structure portion LOOP, a signal (voltage difference between the node voltages V1m and V2m) read out from the ferroelectric devices is amplified in the loop structure portion LOOP, and data ("1" in the example shown in FIG. 16) held in the third memory region is restored as the output signal Q.

Then, at time point R5, the F reset signal FRSTm is changed to "1" again, the transistors Q1ma, Q1mb, Q2ma, and Q2mb are turned on, and the two ends of each of the ferroelectric devices CL1ma, CL1mb, CL2ma, and CL2mb are short circuited. Thus, a state is achieved in which no voltage at all is applied to the ferroelectric devices CL1ma, CL1mb, CL2ma, and CL2mb. At this time, the plate lines PL1m and PL2m are both "0". Thus, the data holding device is restored to a normal operation state as before time point W1.

As described above, in the data holding device of the third modified example, the non-volatile memory portion, which stores the data D held by the loop structure portion LOOP, in a non-volatile manner by using the hysteresis characteristic of the ferroelectric device, includes the number "m" of memory regions each using ferroelectric devices, and the non-volatile memory selects and uses, according to the predetermined control signals SEL1 to SELm, a memory region in which the data D is to be written in or from which the data D is to be read out. This configuration makes it possible to realize a data holding device that can selectively use a plurality of pieces of data D as necessary.

In the normal operation of the data holding device, the ferroelectric devices are cut off from the signal lines, and thus the increase in number of ferroelectric devices does not invite performance degradation (such as speed degradation and an increase of power consumption) of the data holding device.

Figure 17:
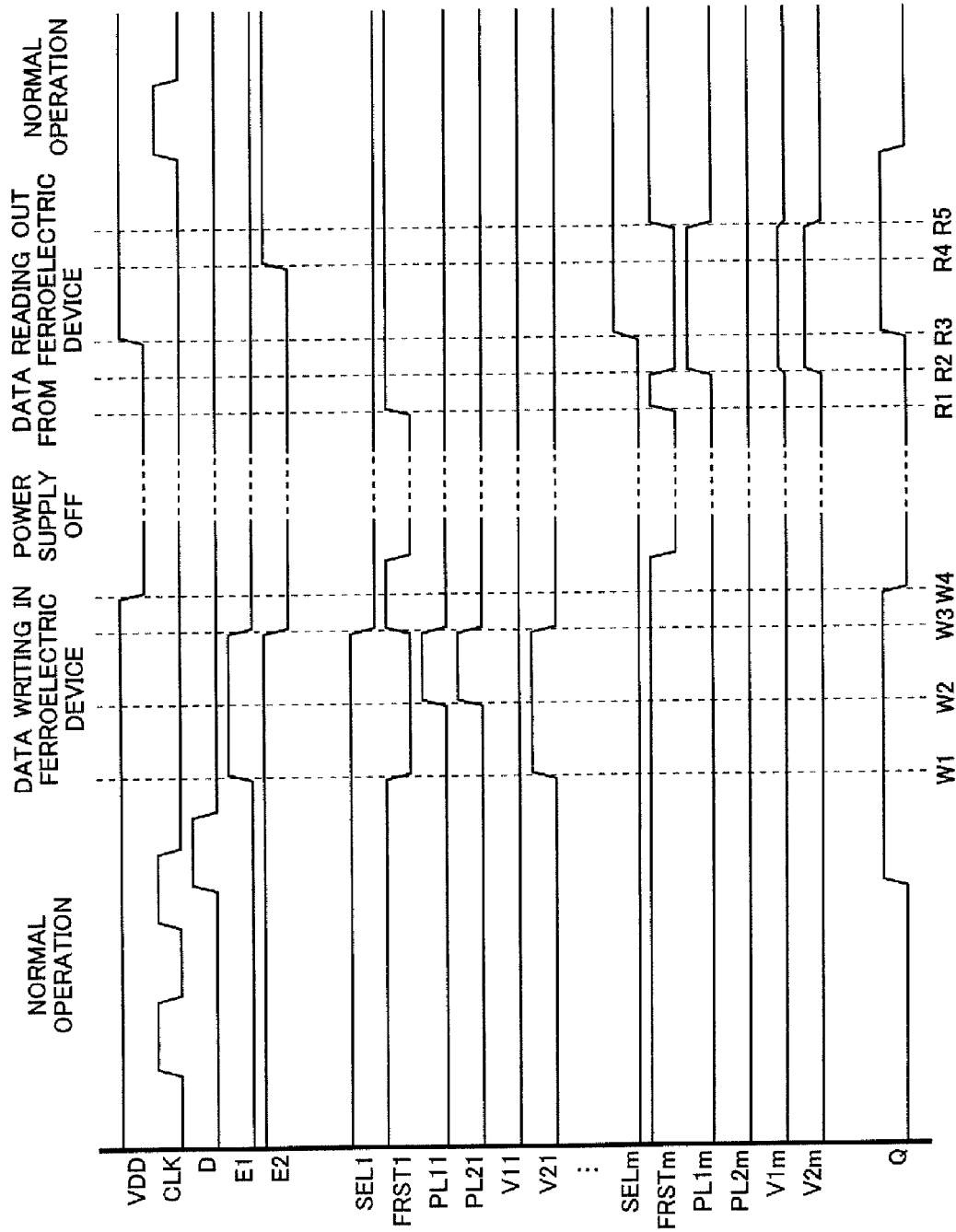
FIG. 17 is a timing chart for illustrating another example of an operation of a data holding device according to the present invention.

Next, a modified example of the operation of reading out data from the third memory region will be described in detail, with reference to FIG. 17. FIG. 17 is a timing chart for illustrating another example of the operation of the data holding device according to the present invention, and there are shown, voltage waveforms of the power supply voltage VDD, the clock signal CLK, the data signal D, the control signal E1, the control signal E2, the control signal SEL1, the F reset signal FRST1, the voltage applied to the plate line PL11, the voltage applied to the plate line PL21, the node voltage V11, the node voltage V21, the control signal SELm, the F reset signal FRSTm, the voltage applied to the plate line PL1m, the voltage applied to the plate line PL2m, the node voltage V1m, the node voltage V2m, and the output signal Q, from top to bottom in this order.

The control signal SELy, the F reset signal FRSTy, the voltage applied to the plate line PL1y, the voltage applied to the plate line PL2y, the node voltage V1y, and the node voltage V2y are related to a "y"th memory region (1<y<m) that is not selected as a memory region in which to write the data D or from which to read out the data D. In the writing operation of data D, the control signal SELy, the F reset signal FRSTy, the voltage applied to the plate line PL1y, the voltage applied to the plate line PL2y, the node voltage V1y, and the node voltage V2y are the same as those in the "m"th region that is not selected as a memory region in which to write the data D; and in the data D read-out operation, they are the same as those in the first memory region that is not selected as a memory region from which to read out the data D. Thus, descriptions and illustrations of them will be omitted whenever possible.

From time point R1 to time point R5, the clock signal CLK is "0", and the inverted clock signal CLKB is "1". Thus, the first pass switch SW1 is off, and the second pass switch SW2 is on. By fixing the clock signal CLK and the inverted clock signal CLKB to predetermined logics in this way, the operation of reading out data from the ferroelectric devices can be performed with enhanced stability.

At time point R1, the F reset signals FRST1 to FRSTm are changed to "1" first of all, to turn on the transistors Q11a to Q1ma, Q11b to Q1mb, Q21a to Q2ma, and Q21b to Q2mb, and the two ends of each of the ferroelectric devices CL11a to CL1ma, CL11b to CL1mb, CL21a to CL2ma, and CL21b to CL2mb are short circuited. Thus, since no voltage at all is applied to the ferroelectric devices CL11a to CL1ma, CL11b to CL1mb, CL21a to CL2ma, and CL21b to CL2mb even at a voltage variation occurring when power is turned on, no unintentional voltage is applied to the ferroelectric devices CL11a to CL1ma, CL11b to CL1mb, CL21a to CL2ma, and CL21b to CL2mb, and this helps avoid damage to data.

At time point R1, the plate lines PL11 to PL1m and the plate lines PL21 to PL2m are all "0 (low level)".

At time point R2, the F reset signal FRSTm is changed to "0", the transistors Q1ma, Q1mb, Q2ma, and Q2mb are turned off, and a state is achieved in which voltages can be applied to the ferroelectric devices CL1ma, CL1mb, CL2ma, and CL2mb. Meanwhile, the plate line PL1m is changed to "1" with the plate line PL2m maintained at "0". By applying the pulse voltages in this way, voltage signals corresponding to the states of remanent polarization in the ferroelectric devices appear as the node voltages V1m and V2m.

Specifically, with reference to the example shown in FIG. 17 (a case in which the data D whose logic is "1" is accommodated in the third memory region), the logic of the node voltage V1m is WL, and the logic of the node voltage V2m is WH. That is, a voltage difference occurs between the node voltages V1m and V2m, corresponding to the difference in state of remanent polarization among the ferroelectric devices.

However, from time point R2 to time point R3, since the power supply voltage VDD has not been turned on yet, the node voltages V3 to V6 of various parts of the loop structure portion LOOP are "0", and thus the output signal Q is "0".

At the next time point R3, the control signal SELm is changed to "1", and the other control signals SEL1 to SEL(m−1) are "0" so as to select the "m"th memory region as a memory region from which the data D is to be read out. As a result, a state is achieved in which a signal path connecting the input terminal and the "m"th output terminal is selected with respect to each of the demultiplexers DeMUX1 and DeMUX2, and a signal path connecting the output terminal and the "m"th input terminal is selected with respect to each of the multiplexers MUX3 and MUX4.

Also, at time point R3, the power supply voltage VDD is turned on, in a state in which the control signals E1 and E2 are both "0" (that is, in a state in which the data writing drivers are disabled and the normal loop is disabled in the loop structure portion LOOP).

From time point R3 to time point R4, the control signal E2 is "0", and the second input terminals (0) of the multiplexers MUX1 and MUX2 are selected; thus the logic of the node voltage V3 is WL, and the logic of the node voltage V4 is WH. The logic of the node voltage V5 is WH, and the logic of the node voltage V6 is WL. Thus, from time point R3 to time point R4, the node voltages V1 to V6 of various portions of the device are in an unstable state (that is, the inverters INV3 and INV4 do not perform logical inversion completely and thus their output logics are not secured to be "0"/"1").

At the next time point R4, the control signal E2 is changed to "1", and the first input terminals (1) of the multiplexers MUX1 and MUX2 are selected; thus the normal loop is formed in the loop structure portion LOOP. Along with this switching of the signal paths, the output terminal (logic: WH) of the inverter INV4 and the input terminal (logic: WH) of the inverter INV3 are connected to each other, and the output terminal (logic: WL) of the inverter INV3 and the input terminal (logic: WL) of the inverter INV4 are connected to each other. Thus, no mismatch occurs among signal logics (WH/WL) of the nodes, and thereafter, during a period in which the normal loop is formed in the loop structure portion LOOP, the inverter INV3 receives an input having a logic WL and tries to raise the logic of its output to "1", and the inverter INV4 receives an input having a logic WH, and tries to lower the logic of its output to "0". As a result, the logic of the output from the inverter INV3 is securely set to "0" instead of the unstable logic WL, and the logic of the output from the inverter INV4 is securely set to "1" instead of the unstable logic WH.

Thus, at time point R4, along with the normal loop being formed in the loop structure portion LOOP, a signal (a voltage difference between the node voltages V1$m$ and V2$m$) read out from the ferroelectric devices is amplified in the loop structure portion LOOP, and data ("1" in the example shown in FIG. 17) held in the third memory region is restored as the output signal Q.

Then, at time point R5, the F reset signal FRSTm is changed to "1" again, the transistors Q1$ma$, Q1$mb$, Q2$ma$, and Q2$mb$ are turned on, and the two ends of each of the ferroelectric devices CL1$ma$, CL1$mb$, CL2$ma$, and CL2$mb$ are short circuited. Thus, a state is achieved in which no voltage at all is applied to the ferroelectric devices CL1$ma$, CL1$mb$, CL2$ma$, and CL2$mb$ is achieved. At this time, the plate lines PL1$m$ and PL2$m$ are both "0". Thus, the data holding device is restored to a normal operation state as before time point W1.

As described above, in the data read-out operation shown in FIG. 17, as distinct from in the data read-out operation shown in FIG. 16, the operation of extracting voltage signals (the node voltages V1$m$ and V2$m$) corresponding to the states of remanent polarization in the ferroelectric devices is started before the power supply voltage VDD is turned on. This makes it possible to reduce the number of operation steps after the power supply voltage VDD is turned on (while three steps (time points R3, R4, R5) are necessary in the operation example shown in FIG. 16, only two steps (time points R4 and R5) are necessary in the operation example shown in FIG. 17), and thus to reduce the time necessary for the data holding device to be restored to the normal operation state.

Figure 18:
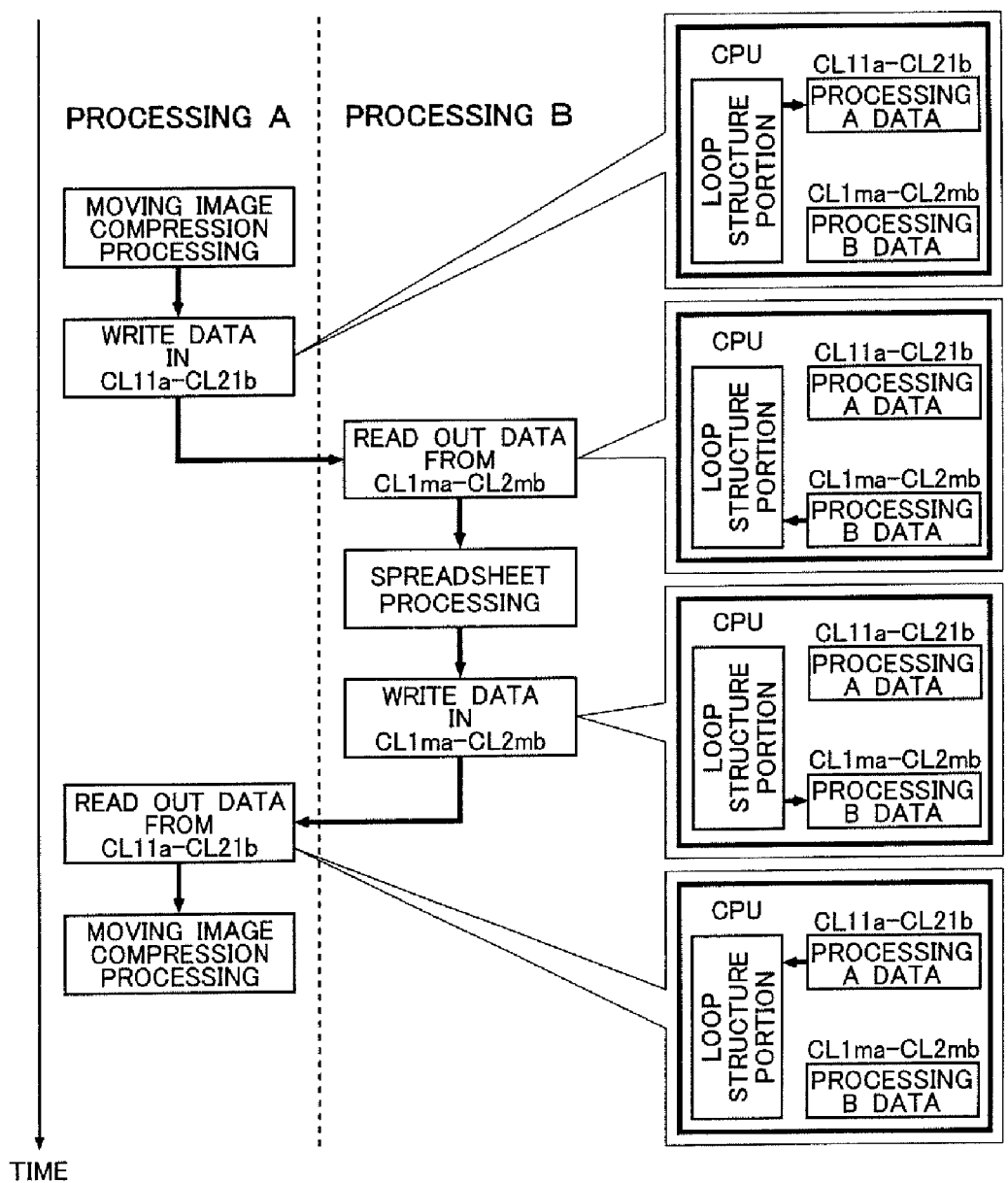
FIG. 18 is a diagram schematically showing an example of a processing switching operation performed by replacement of data.
Figure 22:
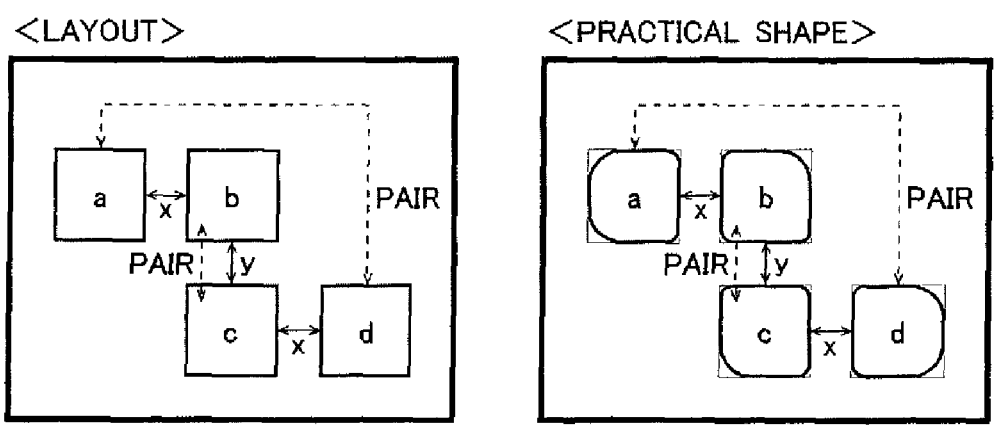
FIG. 22 is a diagram schematically showing a fourth example of a cell-pattern layout.
Figure 23:
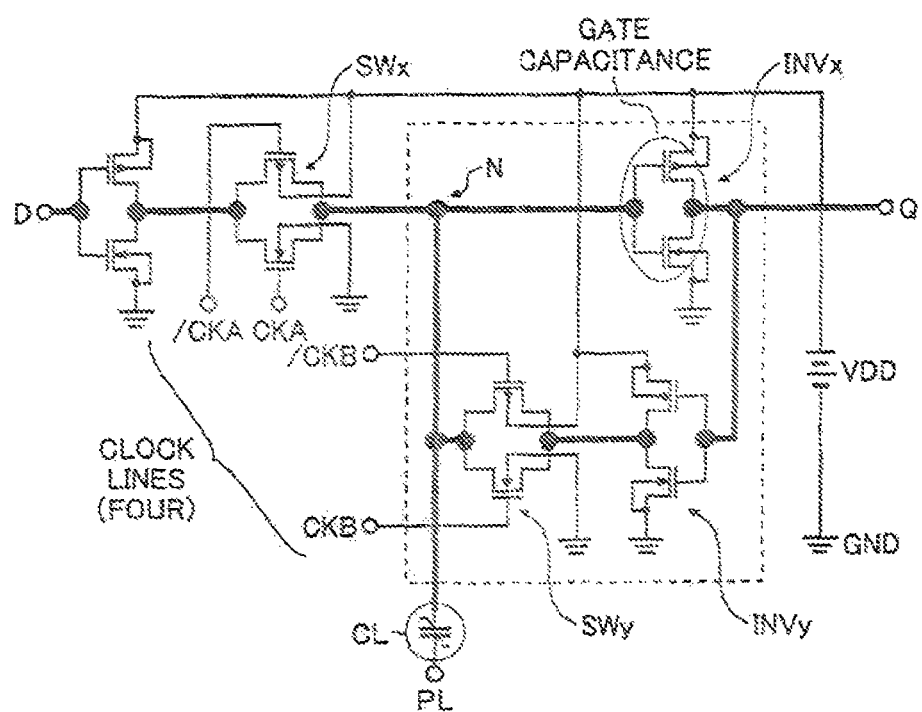
FIG. 23 is a circuit diagram showing a conventional example of a data holding device.
Figure 24:
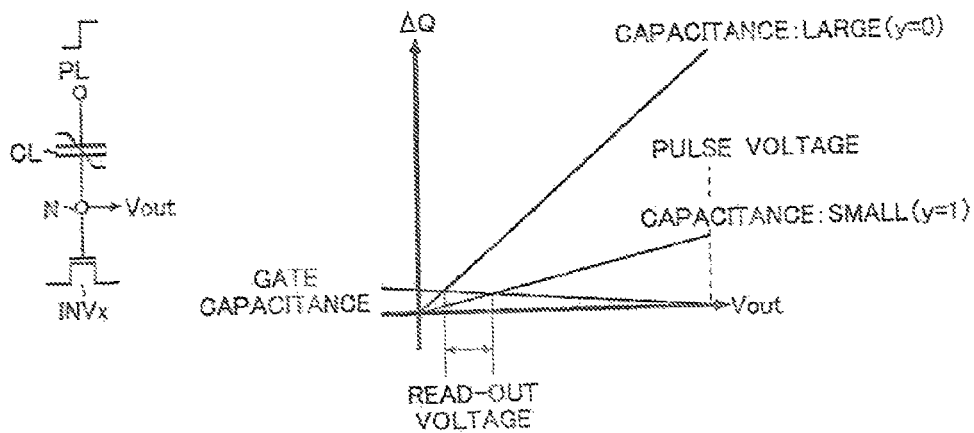
FIG. 24 is a diagram for illustrating a conventional data read-out method.

Next, with reference to FIG. 18$a$, a description will be given of a processing switching operation performed in a case in which the data holding device of the third modified example is applied to a CPU. FIG. 18 is a diagram schematically showing an example of a processing switching operation by data replacement. The figure schematically shows how alternate switching between processing A (for example, moving image compression processing) and processing B (for example, spreadsheet processing) is performed by properly switching between the first and "m"th memory regions of the data holding device. On the left side of FIG. 18, how alternate switching between the processing A and the processing B is performed is shown with the vertical axis indicating time, while operational states of the data holding device used in the CPU are schematically shown on the right side of FIG. 18.

In switching over from the processing A to the processing B, the data holding device writes data DA related to the processing A in the first memory region (CL11$a$ to CL21$b$), and reads out data DB related to the processing B from the "m"th memory region (CL1$ma$ to CL2$mb$), and thereby data replacement processing of data accommodated in the data holding device is performed. Conversely, on the other hand, in switching over from the processing B to the processing A, the data holding device writes the data DB related to the processing B in the "m"th memory region (CL1$ma$ to CL2$mb$) and reads out the data DA related to the processing A from the first memory region (CL11$a$ to CL21$b$), and thereby the data replacement processing of data accommodated in the data holding device is performed. This data replacement processing makes it possible to instantly perform switching of processing performed in the CPU.

If the processing switching in the CPU is performed by replacement of data, the power-off period shown in FIGS. 16 and 17 already referred to above does not need to be provided.

Next, a detailed description will be given of a layout of the ferroelectric devices when they are arranged in a cell pattern, with reference to FIGS. 19 to 22. FIGS. 19 to 22 are diagrams schematically showing first to fourth layout examples, respectively, of the ferroelectric devices in cell patterns. In the figures, symbols "a" to "d" each denote a ferroelectric device, and symbols x and y each denote an inter-device distance.

In forming a plurality of ferroelectric devices on a semiconductor substrate, the ferroelectric devices are all designed to have the same shape (for example, a shape of a square or a rectangle in plan view) in the stage of layout; however, it is often the case that the ferroelectric devices that are practically formed on the semiconductor substrate after processes such as masking and etching are not shaped as designed, due to the characteristics of the processes.

For example, in FIG. 19, since the ferroelectric devices "a" and "d" are arranged such that four sides of each of the ferroelectric devices "a" and "d" are all away from other ferroelectric devices, four corners of each of the ferroelectric devices "a" and "d" are prone to be etched. Thus, the ferroelectric devices "a" and "d", when they are practically formed on the semiconductor substrate, each have a shape in which all the four corners are rounded comparatively large. On the other hand, the ferroelectric devices "b" and "c" are arranged close to each other such that one side of the ferroelectric device "b" faces one side of the ferroelectric device "c", and thus part of the corners on the one side of each of the ferroelectric devices "b" and "c" is less prone to be etched. Thus, the ferroelectric devices "b" and "c", when they are practically formed on the semiconductor substrate, each have a shape in which two corners on the one side are rounded comparatively small, while the other two corners are rounded comparatively large. This applies to the examples shown in FIGS. 20 to 22 as well.

Although the devices practically formed on a semiconductor substrate have shapes in which the four corners are etched to different extents depending on the device arrangement density as described above, it is preferable that, in the pair of ferroelectric devices CL1$a$ and CL1$b$ and in the pair of ferroelectric devices CL2$a$ and CL2$b$, the two ferroelectric devices be arranged such that they will have the same shape when they are practically formed on the semiconductor substrate.

In the example shown in FIG. 19, the ferroelectric devices "a" and "d" may be a first pair of ferroelectric devices, and the ferroelectric devices "b" and "c" may be a second pair of ferroelectric devices. In the example shown in FIG. 20, the ferroelectric devices "a" and "b" may be a first pair, and the ferroelectric devices "c" and "d" may be a second pair (see (a) in the figure), or, the ferroelectric devices "a" and "c" may be a first pair, and the ferroelectric devices "b" and "d" may be a second pair (see (b) in the figure). In the example shown in FIG. 21, the ferroelectric devices "a" and "c" may be a first pair, and the ferroelectric devices "b" and "d" may be a second pair (see (a) in the figure), or, the ferroelectric devices "a" and "b" may be a first pair, and the ferroelectric devices "c" and "d" may be a second pair (see (b) in the figure), or the ferroelectric devices "a" and "d" may be a first pair, and the ferroelectric devices "b" and "c" may be a second pair (see (c) in the figure). In the example shown in FIG. 22, the ferroelectric devices "a" and "d" may be a first pair, and the ferroelectric devices "b" and "c" may be a second pair.

These layouts of the ferroelectric devices in cell patterns make it possible to form the ferroelectric devices in each pair in the same shape (to have the same area) to enhance the pair characteristic thereof, and thus to improve the data holding characteristic of the data holding device.

This applies to the case in which a plurality of memory regions are provided as shown in FIG. 15, where it is important that the two ferroelectric devices have the same shape (same area) in each of the pairs of the ferroelectric devices CL11$a$ to CL1$ma$ and the ferroelectric devices CL111$b$ to CL1$mb$, respectively, and in each of pairs of the ferroelectric devices CL21$a$ to CL1$ma$ and the ferroelectric devices CL21$b$ to CL2$mb$, respectively.

It should be understood that, other than the embodiments described above, many modifications and variations are possible within the spirit of the present invention.

For example, although the above description of the embodiment deals with, as an example, a configuration in which inverters and NAND operation units are used as logic gates forming a loop structure portion LOOP, this is not meant to limit the configuration of the present invention, and other logic gates such as a NOR operation unit can be used.

Although the above description of the embodiment deals with, as an example, a configuration in which the inverters INV6 and INV7 and the pass switches SW3 and SW4 are used in combination as components of the circuit separation portion that electrically separates the loop structure portion LOOP from the non-volatile memory portion, but this is not meant to limit the configuration of the present invention, and a tristate inverter (an inverter capable of floating its output) may be used instead.

The major feature of the circuit separation portion is that it makes it possible not to apply voltages to the ferroelectric devices in a normal operation, and in addition to the configuration (in which voltages applied to the ferroelectric devices in a normal operation are maintained constant) dealt with in the above description of the embodiment as an example, a configuration is possible in which at least one of electrodes for voltage application that the ferroelectric devices have is maintained in a floating state. Specifically, in FIG. 1, a possible method is, for example, a method in which the first and second plate lines PL1 and PL2 are in floating states, while the transistors Q1$a$, Q1$b$, Q2$a$, and Q2$b$ are in off states. Also, the circuit configuration itself may be changed by additionally disposing a transistor between the ferroelectric devices and the node voltage V1 (V2) extraction node, or between the ferroelectric devices and the plate line PL1 (PL2), to be on/off controlled.

Also, to maintain the voltages applied to the ferroelectric devices constant in a normal or data read-out operation, the transistors connected between two ends of the ferroelectric devices need to be on, but the voltages at the plate lines do not necessarily need to be low level.

INDUSTRIAL APPLICABILITY

The present invention offers a technology useful in non-volatilizing data holding devices incorporated in a logic operation circuit, a logic operation device, a processor such as a CPU, an MPU, and a DSP, and a mobile device.

The invention claimed is:
1. A data holding device, comprising:
  a loop structure portion holding data by using a plurality of logic gates that are connected in a loop;
  a non-volatile memory portion storing data held by the loop structure portion, in a non-volatile manner, by using a hysteresis characteristic of a ferroelectric device; and
  a circuit separation portion electrically separating the loop structure portion and the non-volatile memory portion, wherein the circuit separation portion includes:
    a first invertor connected between an input terminal of the loop structure portion and the non-volatile memory portion; and
    a second invertor connected between an output terminal of the loop structure portion and the non-volatile memory portion.
2. The data holding device according to claim 1, wherein, during a normal operation of the data holding device, the circuit separation portion electrically operates the loop structure portion, maintaining a voltage applied to the ferroelectric device at a constant level.
3. The data holding device according to claim 1, wherein, during a normal operation of the data holding device, the circuit separation portion electrically operates the loop structure portion, maintaining at least one of voltage-application electrodes of the ferroelectric device in a floating state.
4. The data holding device according to claim 2 or 3, wherein data is read out from the ferroelectric device by using capacitive coupling between a ferroelectric device in a non-inversion state and a ferroelectric device in an inversion state.
5. The data holding device according to claim 2 or 3, wherein data is read out from the ferroelectric device by using capacitive coupling between the ferroelectric device and a capacitor device other than the ferroelectric device.
6. The data holding device according to claim 1, wherein the non-volatile memory portion has a plurality of memory regions each using a ferroelectric device, and the non-volatile memory selects and uses, according to a predetermined control signal, a memory region in which to write data or from which to read out data.
7. A method of writing data in the data holding device according to claim 1, the method comprising steps of:
  allowing voltage to be applied to a ferroelectric device forming the non-volatile memory portion;
  making a signal path from the loop structure portion to the non-volatile memory portion conductive to apply a voltage signal corresponding to data held by the loop structure portion to one end of the ferroelectric device;
  applying a pulse voltage to an other end of the ferroelectric device to set remanent polarization in the ferroelectric device to either an inversion or non-inversion state;

cutting off the signal path from the loop structure portion to the non-volatile memory portion; and inhibiting a voltage from being applied to the ferroelectric device.

8. A method of reading out data from the data holding device according to claim 1, the method comprising steps of:

allowing a voltage to be applied to a ferroelectric device forming the non-volatile memory portion;

applying a pulse voltage to one end of the ferroelectric device to extract from an other end of the ferroelectric device a voltage signal corresponding to a state of remanent polarization in the ferroelectric device;

making a signal path from the non-volatile-memory portion to the loop structure portion conductive, to input the voltage signal extracted from the non-volatile memory portion to the loop structure portion;

cutting off the signal path from the non-volatile memory portion to the loop structure portion, to make the loop structure portion form a normal loop; and inhibiting a voltage from being applied to the ferroelectric device.

9. The data reading-out method according to claim 8, wherein the step of extracting the voltage signal from the non-volatile memory portion is performed before power is turned on.

10. A data holding device, comprising:

a first multiplexer a first input terminal of which is connected, via a first pass switch, to a terminal to which an input signal is applied;

a first logic gate an input terminal of which is connected to an output terminal of the first multiplexer, and from an output terminal of which an output signal is extracted;

a second multiplexer a first input terminal of which is connected to the output terminal of the first logic gate;

a second logic gate an input terminal of which is connected to an output terminal of the second multiplexer, and an output terminal of which is connected, via a second pass switch, to the first input terminal of the first multiplexer;

a first ferroelectric device one end of which is connected to a first plate line, and an other end of which is connected, via a third pass switch, to the first input terminal of the first multiplexer and also to a second input-terminal of the second multiplexer;

a first transistor electrically connecting/disconnecting both ends of the first ferroelectric device to/from each other;

a second ferroelectric device one end of which is connected to the first plate line and an other end of which is connected, via a fourth pass switch, to the first input terminal of the second multiplexer and also to a second input terminal of the first multiplexer; and a second transistor electrically connecting/disconnecting both ends of the second ferroelectric device to/from each other.

11. The data holding device according to claim 10, wherein, in a normal operation, the first and second pass switches are exclusively on/off-controlled, the third and fourth pass switches, are in an off-state, the first input terminals of the first and second multiplexers are selected, the first and second transistors are in a on-state, and the first plate line is at a certain voltage level or in a floating state;

wherein, in a data writing operation, the first pass switch is in an off-state, the second pass switch is in an on-state, the third and fourth pass switches are in an on-state, the first input terminals of the first and second multiplexers are selected, the first and second transistors are in an off-state, and a pulse voltage is applied to the first plate line; and wherein, in a data read-out operation, the first pass switch is in an off-state, the second pass switch is in an on-state, the third and fourth pass switches are in an off-state, the second input terminals of the first and second multiplexers are selected, the first and second transistors are in an off-state, and a pulse voltage is applied to the first plate line.

12. The data holding device according to claim 11, further comprising:

a third ferroelectric device one end of which is connected to a second plate line and an other end of which is connected to the other end of the first ferroelectric device;

a third transistor electrically connecting/disconnecting both ends of the third ferroelectric device to/from each other;

a fourth ferroelectric device one end of which is connected to the second plate line and an other end of which is connected to the other end of the second ferroelectric device; and a fourth transistor electrically connecting/disconnecting both ends of the fourth ferroelectric, device to/from each other.

13. The data holding device according to claim 12, wherein, in a normal operation, the third and fourth transistors are in an on-state, and the second plate line is at a constant voltage level or in a floating state;

wherein, in a data writing operation, the third and fourth transistors are in an off-state, and a pulse voltage is applied to the second plate line; and wherein, in a data read-out operation, the third and fourth transistors are in an off-state, and the second plate line is at a constant voltage level or in a floating state.

14. The data holding device according to claim 11, further comprising:

a first capacitor device one end of which is connected to a reference voltage terminal and an other end of which is connected to the other end of the first ferroelectric device; and a second capacitor device one end of which is connected to the reference voltage terminal and an other end of which is connected to the other end of the second ferroelectric device.

15. The data holding device according to claim 12, wherein the first to fourth ferroelectric devices are arranged such that the first and third ferroelectric devices will be practically formed on a board as a pair of ferroelectric devices having an equal shape, and the second and fourth ferroelectric devices will be practically formed on the board as a pair of ferroelectric devices having an equal shape.

* * * * *